US012646583B2

(12) United States Patent
Ayyapureddi

(10) Patent No.: US 12,646,583 B2
(45) Date of Patent: Jun. 2, 2026

(54) APPARATUSES AND METHODS FOR HALF-PAGE MODES OF MEMORY DEVICES

(71) Applicant: MICRON TECHNOLOGY, INC., Boise, ID (US)

(72) Inventor: Sujeet Ayyapureddi, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 165 days.

(21) Appl. No.: 18/745,577

(22) Filed: Jun. 17, 2024

(65) Prior Publication Data

US 2025/0078949 A1 Mar. 6, 2025

Related U.S. Application Data

(60) Provisional application No. 63/580,499, filed on Sep. 5, 2023.

(51) Int. Cl.
*G11C 11/408* (2006.01)
*G11C 11/4096* (2006.01)
*G11C 29/52* (2006.01)

(52) U.S. Cl.
CPC .......... *G11C 29/52* (2013.01); *G11C 11/4085* (2013.01); *G11C 11/4087* (2013.01); *G11C 11/4096* (2013.01)

(58) Field of Classification Search
CPC . G11C 29/52; G11C 11/4085; G11C 11/4087; G11C 11/4096

(Continued)

(56) References Cited

U.S. PATENT DOCUMENTS 5,177,705 A * 1/1993 McElroy ................ G11C 16/10
                                                    365/185.26
5,299,164 A * 3/1994 Takeuchi ............... G11C 29/84
                                                    365/201

(Continued)

FOREIGN PATENT DOCUMENTS

WO 2016048634 A1 3/2016
WO 2024107367 A1 5/2024

(Continued)

OTHER PUBLICATIONS

U.S. Appl. No. 19/360,159 titled "Apparatuses and Methods for Enhanced Metadata Support" filed Oct. 16, 2025; pp. all pages of the application as filed.

(Continued)

*Primary Examiner* — Michael T Tran
(74) *Attorney, Agent, or Firm* — Dorsey & Whitney LLP

(57) ABSTRACT

Apparatuses, systems, and methods for half-page modes. A memory device may be operated in a full-page mode where all the memory cells along a word line are used for data or a half-page mode where less than all of the memory cells are used for data. In some memory devices, each half of the memory cells may be separately activated by different word line portions. In some half-page modes, data may be stored along a selected portion of the memory cells and additional information such as metadata or module parity may be stored along the non-selected portion of the memory cells. The additional information may be provided along additional data terminals so as not to increase the data burst length.

20 Claims, 15 Drawing Sheets

(58) Field of Classification Search
USPC ........................................ 365/185.09, 185.24
See application file for complete search history.

(56) References Cited

U.S. PATENT DOCUMENTS

| | | | |
|---|---|---|---|
| 5,434,814 A | 7/1995 | Cho et al. | |
| 6,249,476 B1 | 6/2001 | Yamazaki et al. | |
| 7,117,421 B1* | 10/2006 | Danilak | G06F 11/1008 |
| | | | 714/763 |
| 8,891,313 B2 | 11/2014 | Chang et al. | |
| 9,158,617 B2 | 10/2015 | Cho et al. | |
| 9,195,537 B2 | 11/2015 | Sharon et al. | |
| 9,201,728 B2 | 12/2015 | Patapoutian et al. | |
| 9,361,960 B2 | 6/2016 | Vogelsang | |
| 9,547,550 B1 | 1/2017 | Thakore et al. | |
| 9,607,679 B1 | 3/2017 | Kim et al. | |
| 9,666,291 B2 | 5/2017 | Park | |
| 9,880,901 B2 | 1/2018 | Zastrow | |
| 9,996,799 B2 | 6/2018 | Bostick et al. | |
| 10,127,101 B2 | 11/2018 | Halbert et al. | |
| 10,222,989 B1 | 3/2019 | Zitlaw | |
| 10,243,590 B1 | 3/2019 | Seshadri | |
| 10,810,079 B2 | 10/2020 | Halbert et al. | |
| 10,817,371 B2 | 10/2020 | Rooney et al. | |
| 10,872,011 B2 | 12/2020 | Bains et al. | |
| 10,929,033 B2 | 2/2021 | Meeker et al. | |
| 10,937,517 B1 | 3/2021 | Rich-Plotkin et al. | |
| 10,963,336 B2 | 3/2021 | Veches | |
| 11,010,304 B2 | 5/2021 | Kang et al. | |
| 11,074,126 B2 | 7/2021 | Prather et al. | |
| 11,088,710 B2 | 8/2021 | Lee et al. | |
| 11,177,012 B1 | 11/2021 | Avraham et al. | |
| 11,200,961 B1 | 12/2021 | Uribe | |
| 11,264,085 B1 | 3/2022 | Ware et al. | |
| 11,538,515 B2 | 12/2022 | Ji et al. | |
| 11,579,971 B2 | 2/2023 | Ayyapureddi | |
| 11,580,038 B2 | 2/2023 | Norman et al. | |
| 11,615,861 B2 | 3/2023 | Kim et al. | |
| 11,830,570 B2 | 11/2023 | Laurent et al. | |
| 11,837,316 B1 | 12/2023 | Smith et al. | |
| 12,001,707 B2 | 6/2024 | Boehm et al. | |
| 12,014,797 B2 | 6/2024 | Ayyapureddi | |
| 12,019,513 B2 | 6/2024 | Ayyapureddi | |
| 12,095,474 B1 | 9/2024 | Zhu et al. | |
| 12,204,410 B2 | 1/2025 | Sutera et al. | |
| 12,204,770 B2 | 1/2025 | Ayyapureddi | |
| 12,230,347 B2 | 2/2025 | Suh et al. | |
| 12,249,393 B2 | 3/2025 | Reohr | |
| 12,299,291 B2 | 5/2025 | Eilert et al. | |
| 12,475,965 B2 | 11/2025 | Smith et al. | |
| 12,488,853 B2 | 12/2025 | Smith et al. | |
| 12,511,191 B2 | 12/2025 | Ayyapureddi et al. | |
| 12,512,176 B2 | 12/2025 | Smith et al. | |
| 12,524,298 B2 | 1/2026 | Ayyapureddi | |
| 12,524,306 B2 | 1/2026 | Ayyapureddi | |
| 2003/0081492 A1 | 5/2003 | Farrell et al. | |
| 2003/0117838 A1* | 6/2003 | Hidaka | G11C 11/1659 |
| | | | 365/171 |
| 2006/0233030 A1 | 10/2006 | Choi | |
| 2008/0089129 A1 | 4/2008 | Lee | |
| 2008/0313493 A1 | 12/2008 | Roohparvar et al. | |
| 2009/0097348 A1 | 4/2009 | Minzoni et al. | |
| 2009/0132876 A1 | 5/2009 | Freking et al. | |
| 2009/0168523 A1 | 7/2009 | Shirakawa et al. | |
| 2009/0196103 A1 | 8/2009 | Kim et al. | |
| 2010/0177582 A1 | 7/2010 | Kim et al. | |
| 2010/0177587 A1 | 7/2010 | Huang | |
| 2010/0290146 A1 | 11/2010 | Lam | |
| 2011/0154158 A1 | 6/2011 | Yurzola et al. | |
| 2012/0092940 A1 | 4/2012 | Chang et al. | |
| 2013/0117630 A1 | 5/2013 | Kang | |
| 2013/0275709 A1 | 10/2013 | Gajapathy | |
| 2014/0126300 A1 | 5/2014 | Takahashi et al. | |
| 2015/0193464 A1 | 7/2015 | Kwon et al. | |
| 2015/0262631 A1 | 9/2015 | Shimizu | |
| 2016/0070507 A1 | 3/2016 | Hoshikawa et al. | |
| 2016/0092307 A1 | 3/2016 | Bonen et al. | |
| 2016/0125920 A1 | 5/2016 | Kim et al. | |
| 2016/0307645 A1 | 10/2016 | Kim et al. | |
| 2017/0060681 A1 | 3/2017 | Halbert et al. | |
| 2017/0062067 A1 | 3/2017 | Yang et al. | |
| 2017/0091025 A1 | 3/2017 | Ahn et al. | |
| 2017/0192843 A1 | 7/2017 | Warnes et al. | |
| 2017/0249097 A1 | 8/2017 | Eguchi | |
| 2017/0269992 A1 | 9/2017 | Bandic et al. | |
| 2017/0285990 A1 | 10/2017 | Chen et al. | |
| 2017/0286213 A1 | 10/2017 | Li | |
| 2017/0344423 A1 | 11/2017 | Hsiao et al. | |
| 2018/0025760 A1 | 1/2018 | Mazumder et al. | |
| 2018/0121283 A1 | 5/2018 | Plants | |
| 2018/0150350 A1 | 5/2018 | Cha et al. | |
| 2018/0301203 A1* | 10/2018 | Kim | G11C 11/5628 |
| 2019/0066816 A1 | 2/2019 | Dono | |
| 2019/0073261 A1 | 3/2019 | Halbert et al. | |
| 2019/0103154 A1 | 4/2019 | Cox et al. | |
| 2019/0197171 A1 | 6/2019 | Tiwari et al. | |
| 2019/0206478 A1 | 7/2019 | Jun | |
| 2019/0362792 A1 | 11/2019 | Oh et al. | |
| 2019/0369893 A1 | 12/2019 | Ross | |
| 2019/0371403 A1* | 12/2019 | Maejima | G11C 16/28 |
| 2020/0019462 A1 | 1/2020 | Prather et al. | |
| 2020/0051616 A1 | 2/2020 | Cho | |
| 2020/0104205 A1 | 4/2020 | Noguchi et al. | |
| 2020/0104208 A1 | 4/2020 | Heo et al. | |
| 2020/0194050 A1 | 6/2020 | Akamatsu | |
| 2020/0226039 A1 | 7/2020 | Lee | |
| 2020/0321060 A1* | 10/2020 | Lang | G11C 16/26 |
| 2020/0373941 A1 | 11/2020 | Latorre et al. | |
| 2021/0011645 A1 | 1/2021 | Martinelli et al. | |
| 2021/0012817 A1 | 1/2021 | Laurent et al. | |
| 2021/0012849 A1 | 1/2021 | Kim et al. | |
| 2021/0057003 A1 | 2/2021 | Prather et al. | |
| 2021/0064119 A1 | 3/2021 | Mirichigni et al. | |
| 2021/0064282 A1 | 3/2021 | He et al. | |
| 2021/0064461 A1 | 3/2021 | Veches | |
| 2021/0064467 A1 | 3/2021 | Buerkle et al. | |
| 2021/0083687 A1 | 3/2021 | Lee et al. | |
| 2021/0142848 A1 | 5/2021 | Lim et al. | |
| 2021/0142860 A1 | 5/2021 | Song et al. | |
| 2021/0200630 A1 | 7/2021 | Ishikawa et al. | |
| 2021/0208967 A1 | 7/2021 | Cha et al. | |
| 2021/0224155 A1 | 7/2021 | Bains et al. | |
| 2021/0247910 A1 | 8/2021 | Kim et al. | |
| 2021/0272627 A1 | 9/2021 | Lee | |
| 2021/0294692 A1 | 9/2021 | Chen | |
| 2021/0311821 A1 | 10/2021 | Ryu et al. | |
| 2021/0311822 A1 | 10/2021 | Jannusch et al. | |
| 2021/0311830 A1 | 10/2021 | Lee | |
| 2021/0357287 A1 | 11/2021 | Kim et al. | |
| 2021/0358559 A1 | 11/2021 | Suh et al. | |
| 2021/0365316 A1 | 11/2021 | Nale et al. | |
| 2021/0406123 A1 | 12/2021 | Nakanishi et al. | |
| 2022/0027090 A1 | 1/2022 | Kwon et al. | |
| 2022/0035529 A1 | 2/2022 | Bennett | |
| 2022/0084565 A1 | 3/2022 | Prather et al. | |
| 2022/0091938 A1 | 3/2022 | Buerkle et al. | |
| 2022/0129196 A1 | 4/2022 | Roberts et al. | |
| 2022/0138065 A1 | 5/2022 | Secatch et al. | |
| 2022/0197739 A1 | 6/2022 | Ryu et al. | |
| 2022/0261310 A1* | 8/2022 | Ishikawa | G06F 11/1068 |
| 2022/0334917 A1 | 10/2022 | Veches | |
| 2022/0337271 A1 | 10/2022 | Hanna | |
| 2022/0365692 A1 | 11/2022 | Vankamamidi et al. | |
| 2022/0398042 A1* | 12/2022 | Song | G06F 3/0659 |
| 2022/0415398 A1 | 12/2022 | Lien et al. | |
| 2023/0009642 A1 | 1/2023 | Eilert et al. | |
| 2023/0146549 A1 | 5/2023 | Lien et al. | |
| 2023/0161665 A1 | 5/2023 | Choi et al. | |
| 2023/0185665 A1 | 6/2023 | Ayyapureddi | |
| 2023/0223096 A1 | 7/2023 | Bains et al. | |
| 2023/0236747 A1 | 7/2023 | Curewitz et al. | |
| 2023/0289072 A1 | 9/2023 | Cho et al. | |
| 2023/0298682 A1 | 9/2023 | Suh et al. | |
| 2023/0350581 A1 | 11/2023 | Ayyapureddi | |

(56) References Cited

U.S. PATENT DOCUMENTS

| 2023/0350748 | A1 | 11/2023 | Ayyapureddi |
| 2023/0352064 | A1 | 11/2023 | Ayyapureddi |
| 2023/0352112 | A1 | 11/2023 | Ayyapureddi |
| 2024/0004754 | A1 | 1/2024 | Veches |
| 2024/0029781 | A1 | 1/2024 | Schreck et al. |
| 2024/0079074 | A1 | 3/2024 | Bak et al. |
| 2024/0086520 | A1 | 3/2024 | Kaplan et al. |
| 2024/0096404 | A1 | 3/2024 | Cho et al. |
| 2024/0126438 | A1 | 4/2024 | Suh et al. |
| 2024/0160351 | A1 | 5/2024 | Ayyapureddi et al. |
| 2024/0160524 | A1 | 5/2024 | Ayyapureddi et al. |
| 2024/0160527 | A1 | 5/2024 | Ayyapureddi et al. |
| 2024/0161855 | A1 | 5/2024 | Smith et al. |
| 2024/0161856 | A1 | 5/2024 | Smith et al. |
| 2024/0161859 | A1 | 5/2024 | Ayyapureddi et al. |
| 2024/0170088 | A1 | 5/2024 | Smith et al. |
| 2024/0176699 | A1 | 5/2024 | Ayyapureddi et al. |
| 2024/0177794 | A1 | 5/2024 | Vogelsang |
| 2024/0220142 | A1* | 7/2024 | Park ..................... G06F 3/0679 |
| 2024/0220149 | A1 | 7/2024 | Kim et al. |
| 2024/0248796 | A1 | 7/2024 | Ayyapureddi |
| 2024/0256380 | A1 | 8/2024 | Ayyapureddi |
| 2024/0256382 | A1 | 8/2024 | Ayyapureddi |
| 2024/0272979 | A1 | 8/2024 | Ayyapureddi |
| 2024/0272984 | A1 | 8/2024 | Ayyapureddi |
| 2024/0273014 | A1 | 8/2024 | Ayyapureddi |
| 2024/0274223 | A1 | 8/2024 | Ayyapureddi |
| 2024/0281327 | A1 | 8/2024 | Ayyapureddi et al. |
| 2024/0289266 | A1 | 8/2024 | Ayyapureddi |
| 2024/0321328 | A1 | 9/2024 | Ayyapureddi |
| 2024/0377952 | A1 | 11/2024 | Song et al. |
| 2024/0394178 | A1 | 11/2024 | Partsch |
| 2024/0419538 | A1 | 12/2024 | Huang et al. |
| 2025/0077103 | A1 | 3/2025 | Ayyapureddi |
| 2025/0077424 | A1 | 3/2025 | Ayyapureddi |
| 2025/0078906 | A1 | 3/2025 | Kim et al. |
| 2025/0078950 | A1 | 3/2025 | Ayyapureddi |
| 2025/0110643 | A1 | 4/2025 | Ayyapureddi |
| 2025/0110825 | A1 | 4/2025 | Ayyapureddi |
| 2025/0110830 | A1 | 4/2025 | Ayyapureddi |
| 2025/0111887 | A1 | 4/2025 | Ayyapureddi |
| 2025/0112643 | A1 | 4/2025 | Ayyapureddi |
| 2025/0123924 | A1 | 4/2025 | Ayyapureddi et al. |
| 2025/0138940 | A1 | 5/2025 | Cho et al. |
| 2025/0156087 | A1 | 5/2025 | Ayyapureddi |
| 2025/0165160 | A1 | 5/2025 | Eilert et al. |

FOREIGN PATENT DOCUMENTS

| WO | 2024107503 | A1 | 5/2024 |
| WO | 2024107504 | A1 | 5/2024 |
| WO | 2024167711 | A1 | 8/2024 |
| WO | 2025053912 | A1 | 3/2025 |
| WO | 2025075696 | A1 | 4/2025 |
| WO | 2025075697 | A1 | 4/2025 |

OTHER PUBLICATIONS

PCT Application No. PCT/US24/39192 titled "Apparatuses and Methods for Scalable 1-Pass Error Correction Code Operations" filed Jul. 23, 2024, pp. all pages of the application as filed.
PCT Application No. PCT/US24/39195 titled "Apparatuses and Methods for Half-Page Modes of Memory Devices" filed Jul. 23, 2024, pp. all pages of the application as filed.
PCT Application No. PCT/US24/39231 titled "Apparatuses and Methods for Granular Single-Pass Metadata Access Operations" filed Jul. 24, 2024, pp. all pages of the application as filed.
U.S. Appl. No. 17/730,381, titled "Apparatuses, Systems, and Methods for Per Row Error Scrub Information", filed Apr. 27, 2022; pp. all pages of application as filed.
U.S. Appl. No. 17/730,396, titled "Apparatuses, Systems, and Methods for Per Row Error Scrub Information Registers", filed Apr. 27, 2022; pp. all pages of application as filed.

U.S. Appl. No. 17/731,024, titled "Apparatuses, Systems, and Methods for Managing Metadata Storage at a Memory", filed Apr. 27, 2022; pp. all pages of the application as filed.
U.S. Appl. No. 18/424,282 titled "Apparatuses and Methods for Bounded Fault Compliant Metadata Storage" filed Jan. 26, 2024; pp. all pages of application as filed.
U.S. Appl. No. 18/424,342 titled "Apparatuses and Methods for Bounded Fault Compliant Metadata Storage" filed Jan. 26, 2024; pp. all pages of application as filed.
U.S. Appl. No. 18/430,381, titled "Apparatuses, Systems, and Methods for Storing Memory Metadata", filed Feb. 1, 2024; pp. all pages of application as filed.
U.S. Appl. No. 18/430,406, titled "Apparatuses, Systems, and Methods for Storing Memory Metadata", filed Feb. 1, 2024; pp. all pages of application as filed.
U.S. Appl. No. 18/431,232, titled "Apparatuses, Systems, and Methods for Storing Memory Metadata", filed Feb. 2, 2024; pp. all pages of application as filed.
U.S. Appl. No. 18/431,306, titled "Apparatuses, Systems, and Methods for Storing Memory Metadata", filed Feb. 2, 2024; pp. all pages of application as filed.
U.S. Appl. No. 18/441,775 titled "Apparatuses and Methods for Settings for Adjustable Write Timing" filed Feb. 14, 2024, pp. all pages of the application as filed.
U.S. Appl. No. 18/441,830 titled "Apparatuses, Systems, and Methods for Storing and Accessing Memory Metadata and Error Correction Code Data" filed Feb. 14, 2024, pp. all pages of the application as filed.
U.S. Appl. No. 18/504,215 titled "Apparatuses and Methods for Enhanced Metadata Support" filed Nov. 8, 2023; pp. all pages of application as filed.
U.S. Appl. No. 18/504,234 titled "Apparatuses and Methods for Enhanced Metadata Support" filed Nov. 8, 2023; pp. all pages of application as filed.
U.S. Appl. No. 18/504,302 titled "Apparatuses and Methods for Configurable ECC Modes" filed Nov. 8, 2023; pp. all pages of application as filed.
U.S. Appl. No. 18/504,316 titled "Apparatuses and Methods for Configurable ECC Modes" filed Nov. 8, 2023; all pages of application as filed.
U.S. Appl. No. 18/504,324 titled "Apparatuses and Methods for Single-Pass Access of ECC Information, Metadata Information or Combinations Thereof" filed Nov. 8, 2023, all pages of application as filed.
U.S. Appl. No. 18/504,342 titled "Apparatuses and Methods for Single-Pass Access of ECC Information, Metadata Information or Combinations Thereof" filed Nov. 8, 2023; pp. all pages of application as filed.
U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.
U.S. Appl. No. 18/504,362 titled "Apparatuses and Methods for Separate Write Enable for Single-Pass Access of Data, Metadata, and Parity Information" filed Nov. 8, 2023; pp. all pages of application as filed.
U.S. Appl. No. 18/625,539, titled "Apparatuses, Systems, and Methods for Per Row Error Scrub Information" filed Apr. 3, 2024, pp. all pages of application as filed.
U.S. Appl. No. 17/730,992 titled "Apparatuses, Systems, and Methods for Managing Metadata Security and Access" filed Apr. 27, 2022, pp. all pages of application as filed.
U.S. Appl. No. 18/743,994 titled "Apparatuses and Methods for Shared Codeword in 2-Pass Access Operations" filed Jun. 14, 2024, pp. all pages of the application as filed.
U.S. Appl. No. 18/745,843 titled "Apparatuses and Methods for Half-Page Modes of Memory Devices" filed Jun. 17, 2024, pp. all pages of the application as filed.
U.S. Appl. No. 18/745,877 titled "Apparatuses and Methods for Half-Page Modes of Memory Devices" filed Jun. 17, 2024, pp. all pages of the application as filed.

(56) References Cited

OTHER PUBLICATIONS

U.S. Appl. No. 18/745,894 titled "Apparatuses and Methods for Half-Page Modes of Memory Devices" filed Jun. 17, 2024, pp. all pages of the application as filed.

U.S. Appl. No. 18/747,658, titled "Apparatuses and Methods for Bounded Fault Compliant Metadata Storage" filed Jun. 19, 2024, pp. all pages of application as filed.

U.S. Appl. No. 18/747,676, titled "Apparatuses and Methods for Alternate Memory Die Metadata Storage", filed Jun. 19, 2024, pp. all pages of application as filed.

U.S. Appl. No. 18/747,696, titled "Apparatuses and Methods for Scalable 1-Pass Error Correction Code Operations", filed Jun. 19, 2024, pp. all pages of application as filed.

U.S. Appl. No. 18/747,712, titled "Apparatuses and Methods for Granular Single-Pass Metadata Access Operations" filed Jun. 19, 2024, pp. all pages of application as filed.

U.S. Appl. No. 18/747,635, titled "Apparatuses and Methods for Read/Modify/Write Single-Pass Metadata Access Operations" filed Jun. 19, 2024, pp. all pages of application as filed.

Lumenci Team "High Bandwidth Memory (HBM3)" https://lumenci.com/blogs/high-bandwidth-memory; Editorial Team at Lumenci, Jul. 14, 2022; pp. 1-3.

U.S. Appl. No. 19/025,934, titled "Apparatuses, Systems, and Methods for Managing Metadata Security and Access" filed Jan. 16, 2025, pp. all pages of application as filed.

Chen et al., "CATCAM: Constant-time Alteration Ternary CAM with Scalable In-Memory Architecture"; 2020 53rd Annual IEEE/ACM International Symposium on Microarchitecture (MICRO), Athens, Green; Oct. 17-21, 2020; pp. 342-355.

J. F. Philippe Marchand "An Alterable Programmable Logic Array"; IEEE Journal of Solid-State Circuits, vol. sc-20, No. 5, Oct. 1985; pp. 1061-1066.

U.S. Appl. No. 19/366,908 titled "Apparatuses and Methods for Configurable ECC Modes", filed Oct. 23, 2025; pp. all pages of application as filed.

U.S. Appl. No. 19/376,027 titled "Apparatuses and Methods for Single-Pass Access of ECC Information, Metadata Information or Combinations Thereof", filed Oct. 31, 2025; pp. all pages of application as filed.

U.S. Appl. No. 19/381,448 titled "Apparatuses and Methods for Enhanced Metadata Support", filed Nov. 6, 2025; pp. all pages of application as filed.

U.S. Appl. No. 19/431,541, titled "Apparatuses And Methods For Bounded Fault Compliant Metadata Storage" filed Dec. 23, 2025, pp. all pages of application as filed.

U.S. Appl. No. 19/435,124 titled "Apparatuses, Systems, and Methods for Storing Memory Metadata", filed Dec. 29, 2025; pp. all page of the application as filed.

U.S. Appl. No. 19/441,648, titled "Apparatuses, Systems, and Methods for Storing and Accessing Memory Metadata and Error Correction Code Data" filed Jan. 6, 2026; pp. all pages of application as filed.

Handy, Jim, "Emerging Memories Today: Understanding Bit Selectors", The Memory Guy Blog, Objective Analysis on Semiconductor Memories, Nov. 2018, 5 pgs.

* cited by examiner

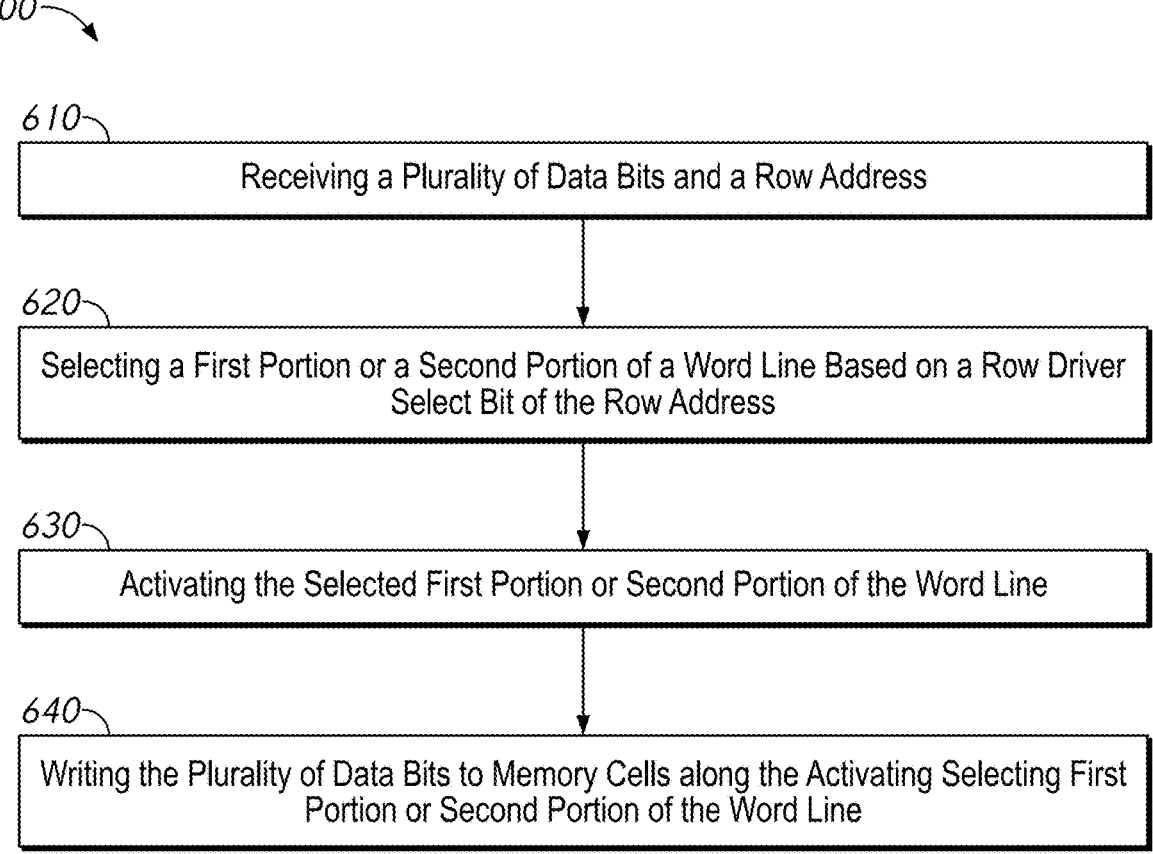

600

610

Receiving a Plurality of Data Bits and a Row Address

620

Selecting a First Portion or a Second Portion of a Word Line Based on a Row Driver Select Bit of the Row Address

630

Activating the Selected First Portion or Second Portion of the Word Line

640

Writing the Plurality of Data Bits to Memory Cells along the Activating Selecting First Portion or Second Portion of the Word Line

FIG. 6

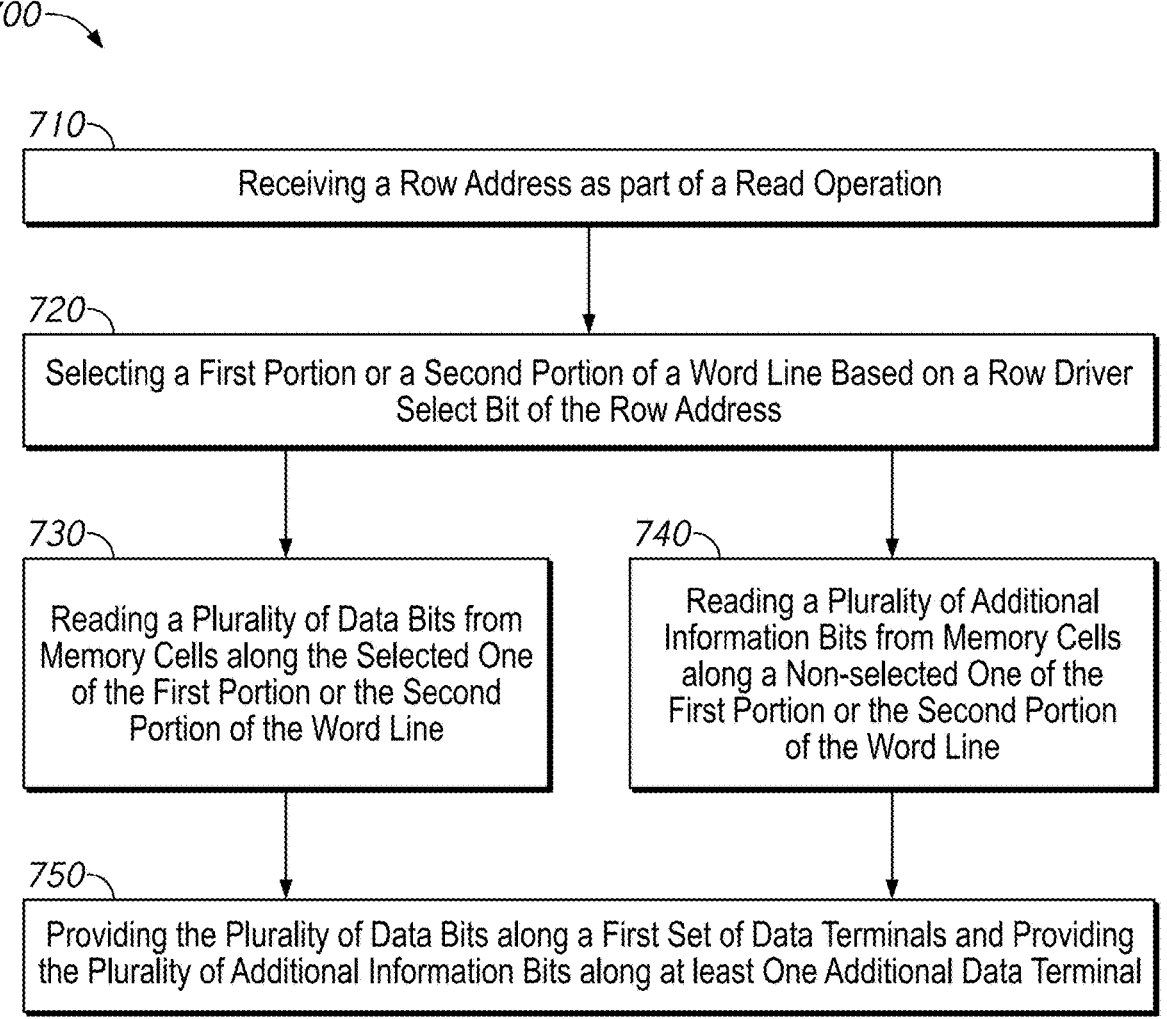

700

710
Receiving a Row Address as part of a Read Operation

720
Selecting a First Portion or a Second Portion of a Word Line Based on a Row Driver Select Bit of the Row Address 730
Reading a Plurality of Data Bits from Memory Cells along the Selected One of the First Portion or the Second Portion of the Word Line 740
Reading a Plurality of Additional Information Bits from Memory Cells along a Non-selected One of the First Portion or the Second Portion of the Word Line 750
Providing the Plurality of Data Bits along a First Set of Data Terminals and Providing the Plurality of Additional Information Bits along at least One Additional Data Terminal

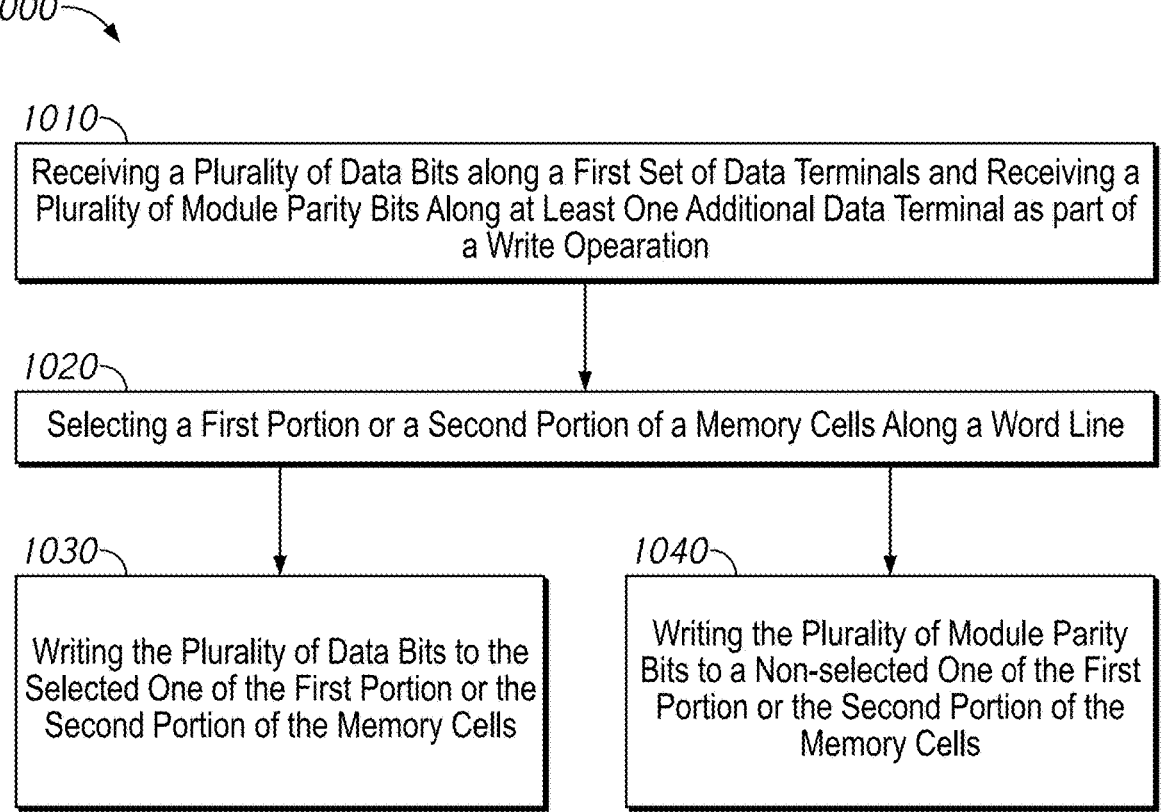

1010

Receiving a Plurality of Data Bits along a First Set of Data Terminals and Receiving a Plurality of Module Parity Bits Along at Least One Additional Data Terminal as part of a Write Opearation

1020

Selecting a First Portion or a Second Portion of a Memory Cells Along a Word Line

1030

Writing the Plurality of Data Bits to the Selected One of the First Portion or the Second Portion of the Memory Cells

1040

Writing the Plurality of Module Parity Bits to a Non-selected One of the First Portion or the Second Portion of the Memory Cells

FIG. 10

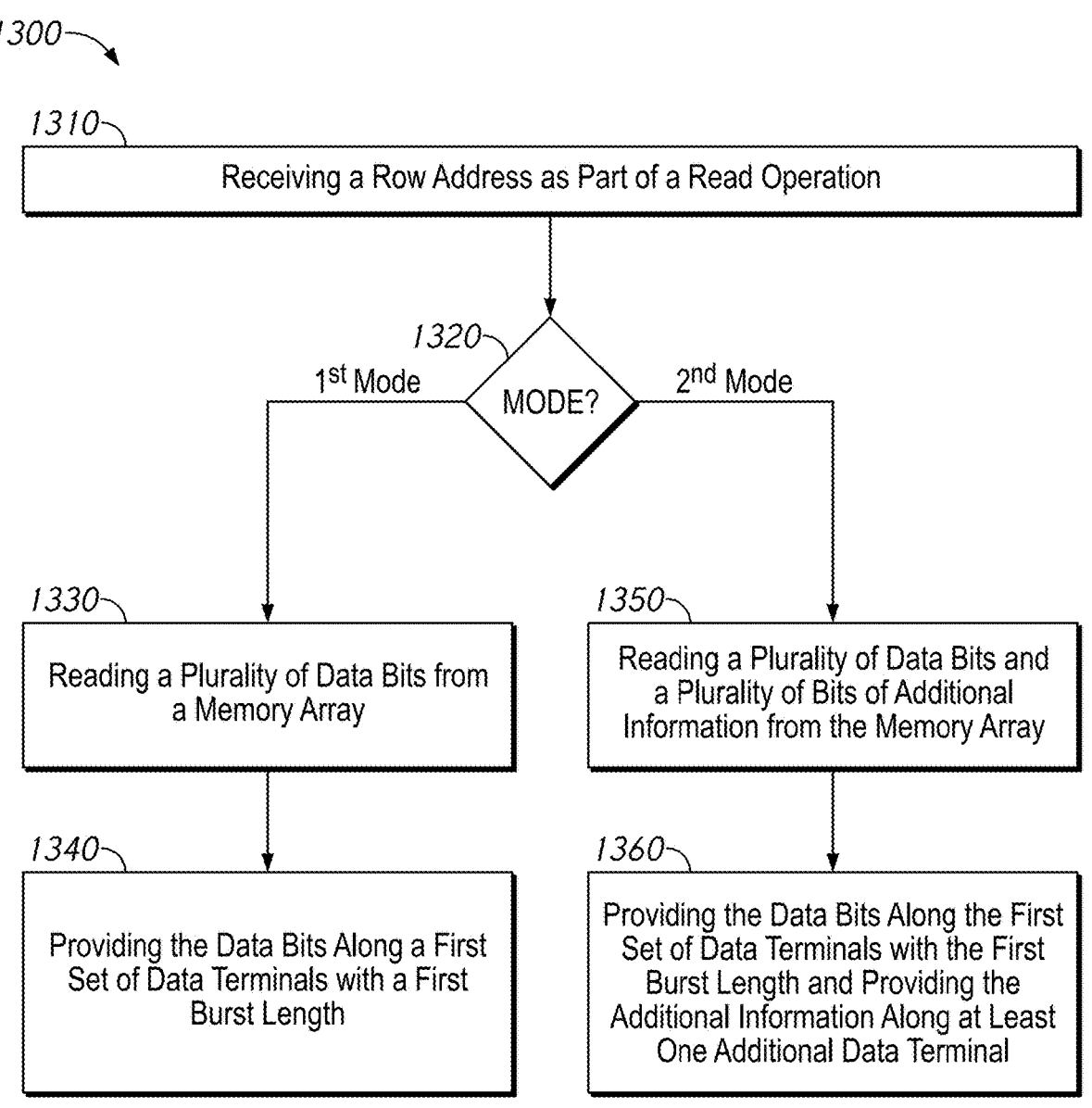

*1300*

*1310*
Receiving a Row Address as Part of a Read Operation

*1320*
MODE?

1st Mode

2nd Mode

*1330*
Reading a Plurality of Data Bits from a Memory Array

*1350*
Reading a Plurality of Data Bits and a Plurality of Bits of Additional Information from the Memory Array

*1340*
Providing the Data Bits Along a First Set of Data Terminals with a First Burst Length

*1360*
Providing the Data Bits Along the First Set of Data Terminals with the First Burst Length and Providing the Additional Information Along at Least One Additional Data Terminal

*FIG. 13*

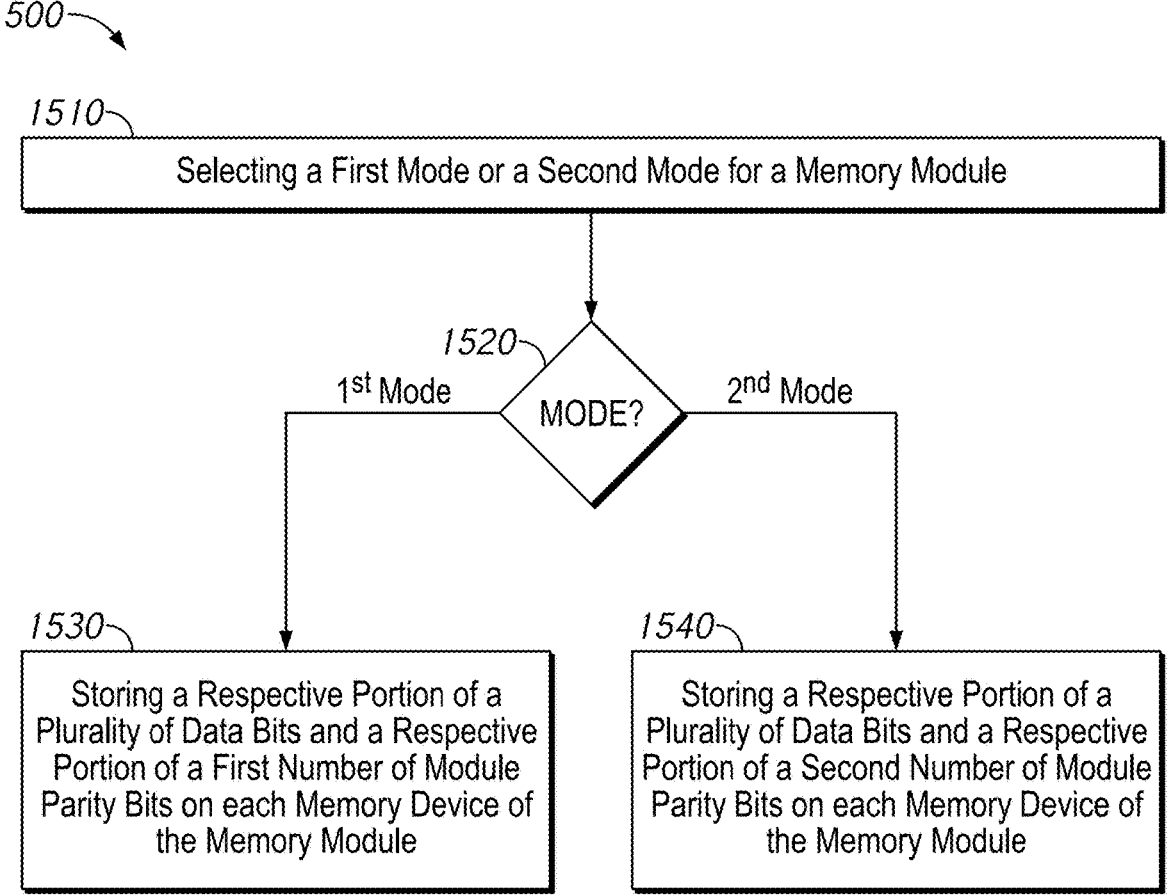

1500

1510

Selecting a First Mode or a Second Mode for a Memory Module

1520

1st Mode          MODE?          2nd Mode

1530

Storing a Respective Portion of a Plurality of Data Bits and a Respective Portion of a First Number of Module Parity Bits on each Memory Device of the Memory Module

1540

Storing a Respective Portion of a Plurality of Data Bits and a Respective Portion of a Second Number of Module Parity Bits on each Memory Device of the Memory Module

FIG. 15

APPARATUSES AND METHODS FOR HALF-PAGE MODES OF MEMORY DEVICES

CROSS REFERENCE TO RELATED APPLICATION(S)

This application claims the benefit under 35 U.S.C. § 119 of the earlier filing date of U.S. Provisional Application Ser. No. 63/580,499 filed Sep. 5, 2023 the entire contents of which are hereby incorporated by reference in its entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During an access operation, an access command may be received along with address information which specifies which memory cells should be accessed. Memory devices may be packaged together onto a module.

There is growing interest in increasing the efficiency of memory devices and memory modules both to decrease unnecessary power consumption during operations, and to allow for additional information to be included on the module. Certain memory modes may involve accessing fewer than the maximum number of bits which can be accessed at one time. There may be a need for various improvements to how those bits are accessed and/or to how the non-accessed bits are used to improve efficiency.

BRIEF DESCRIPTION OF THE DRAWINGS

FIG. 6 is a flow chart of a method of writing data in a half-page mode according to some embodiments of the present disclosure.

FIG. 7 is a flow chart of a method of reading data and additional information from a memory device according to some embodiments of the present disclosure.

FIG. 10 is a flow chart of a method of writing data and module parity to a memory device according to some embodiments of the present disclosure.

FIG. 13 is a flow chart of a method of providing additional information along additional data terminals when additional information is enabled according to some embodiments of the present disclosure.

FIG. 15 is a method of switching between module parity modes according to some embodiments of the present disclosure.

DETAILED DESCRIPTION

Figure 1:
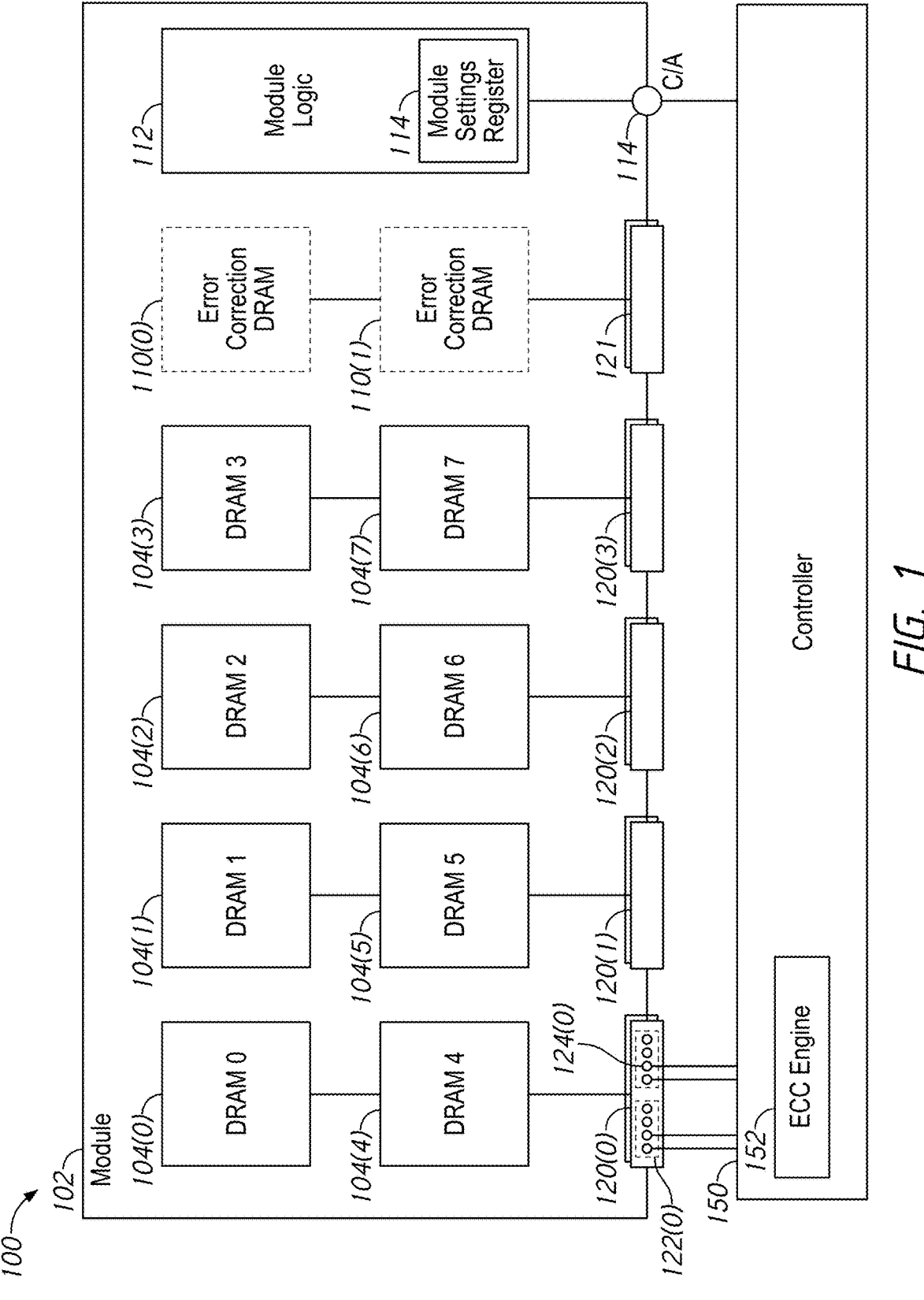
FIG. 1 is a block diagram of a memory system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). The columns may be grouped together into column planes, and a column select (CS) signal may be used to select a set of columns within each of the active column planes to provide data. When an access command is received, the memory may prefetch a codeword (e.g., a number of bits of data) along with one or more associated bits of information from the memory array and either replace the prefetched data with new data (e.g., as part of a write operation) or provide the prefetched data off the memory device (e.g., as part of a read operation).

Memory devices may store additional information which is associated with each codeword. For example, the additional information may include metadata which includes information about the data codeword (or is a portion of information about a larger set of data which includes the codeword), information (e.g., module parity bits) related to error correction on the controller, or combinations thereof. The memory may also store parity bits which are used for on-device error correction.

Memory devices may be packaged together onto a memory module. The memory module may include a number of memory devices, each of which stores data. A controller may access one or more memory devices on the module. The controller may have its own error correction engine, which may use module level parity bits to correct information received from the module. The module includes a number of channels, each including a number of data (DQ) terminals which couple data (and sometimes additional information) to/from the controller.

The memory devices may be operated in a mode where less than all of the memory cells along a word line which can be accessed at once, and less than all of the DQ terminals are used for data. For example, a full-page mode may access data along all of the memory cells along the word line which the memory is capable of accessing at once (e.g., 128 bits of data) while in a half-page mode, data may be accessed in half of the memory cells which can be accessed at one time (e.g., 64 bits of data). It may be useful to leverage the architecture of the memory to optimize power consumption in this operational mode, to take advantage of the non-selected DQ terminals to more efficiently utilize module resources or additional information storage, or combinations thereof.

The present disclosure is drawn to apparatuses, systems, and methods for half-page modes. In at least one aspect, the present disclosure relates to a memory with separately addressed word line drivers (or row drivers) per word line. Each word line may be separated into multiple portions, each of which is activated by an associated row driver. In some operational modes, the row driver may selectively activate one or more of the row drivers based on one or more row driver select bits in the row address. These row driver select bits may be in addition to the number of bits in the row address used in a full-page mode. Since the row drivers may be separately activated, in modes such as half-page modes where less then all of the memory cells along a word line are accessed, only the portion intersecting the accessed memory cells needs to be activated, leading to power savings.

In an example implementation, the memory may divide each word line into two portions, each driven by a respective row driver. In a half-page mode, the row address includes an extra bit used as a row driver select bit which determines which of the two row drivers activates. In an example operation in a half-page mode, the memory may receive a row address which specifies a first or a second half of the word line. A corresponding row driver is activated and the half of the word line intersecting the selected memory cells is activated, while the half of the word line which intersects the non-selected memory cells may remain inactive. This may offer a power savings, since the word line which intersects the non-accessed column planes does not need to fire and its sense amplifiers do not need to be triggered.

The use of half-page modes may also be useful in allowing additional information to be stored on the memory device and to enable different operational modes based on the amount and type of additional information stored on the memory devices. For example, if data is accessed along half of the memory cells which the memory is capable of accessing at once, then additional information may be accessed in the other half of the memory cells. In some embodiments, a memory device which uses a one or more row address bits to select a portion of the word line may be used (e.g., to take advantage of power savings). However, other architectures may also be used. For example, additional information may be stored in memory devices which use a bit of the column address to select portions of the memory cells along a word line.

In at least one aspect, the present disclosure relates to a memory module, where module parity bits are stored on the data memory devices of the module in a half-page mode. In a memory module operated in a full-page mode, extra memory devices (or error correction memory devices) may be used to store the module parity bits. However, this may be inefficient as the extra memory devices require power etc. during operation. In a memory module of the present disclosure, a mode may be enabled where the module parity is instead stored on the data memory devices of the module, and the error correction memory devices may be omitted (or disabled). For example, each memory device may store a portion of the data and a portion of the module parity which is accessed by the controller (e.g., instead of some devices storing portions of the data and some devices storing portions of the module parity). In some embodiments, a memory module may have selectable amounts of module parity to enable different levels of error correction.

In at least one aspect, the present disclosure relates to a memory module where when additional information (e.g., module parity, metadata, or combinations thereof) is enabled, it is transmitted in parallel to the data. During access operations where additional information is enabled, the data may be transmitted along a set of data terminals, while the additional information is transmitted along at least one additional data terminal. The burst length, or number of serial bits transmitted along each terminal, may remain the same whether additional information is enabled or not, which may save on time. An example memory device may include 8 data (or DQ) terminals divided into two pseudo-channels. During a 2p2 mode when additional information is disabled, data may be transmitted along two of the DQ terminals in a pseudo channel using a burst length of 32 bits. When additional information is enabled (e.g., a 2p3 mode) then the two DQ terminals may still transmit data with a burst length of 32 bits, while the additional information is provided along a $3^{rd}$ DQ terminal of the pseudo-channel.

As used herein, the term data may represent any bits of information that the controller wishes to store and/or retrieve from the memory. The term metadata may represent any bits of information about the data which the controller writes to and/or receives from the memory. For example, the metadata may be information that the controller generates about the data, about how or where the data memory is stored in the memory, about how many errors have been detected in the data, etc. The term module parity may represent any bits used for error correction capabilities external to the memory device (e.g., on the module and/or on the controller). The data, metadata, and/or module parity represent information written to the memory by a controller and then also read from the memory by the controller, with the data, metadata, and module parity differing in content and how they are generated in that the metadata is based on information about the data and the module parity is generated based on the data and metadata. The term parity may represent any bits generated by an error correction circuit of the memory based on the data, metadata, module parity, or combinations thereof. While the terminology 'parity' and 'module parity' is used, any error correction scheme may be used, and the parity bits and module parity bits may represent error correction bits used for any type of error correction scheme. The parity may generally stay within the memory while the module parity may be written to and read from the memory. In some embodiments, the amount of data, metadata, and/or module parity retrieved as part of a single access operation may represent a set of bits which are a fragment of a larger piece of information. For example, the metadata bits retrieved as part of a single access operation (e.g., 4 bits) may not have any meaning on their own, but may have meaning when combined with sets of metadata bits retrieved as part of other access operations (e.g., to other memory arrays and/or to the same array at different times).

FIG. 1 is a block diagram of a memory system according to some embodiments of the present disclosure. The memory system 100 includes a memory module 102 and a controller 150 which operates the memory module 102. The module includes a number of memory devices 104 which may be referred to as data memory devices. The module also may include optional error correction memory devices 110. The data memory devices 104 may be used to store data, while (in embodiments where they are present/active) the error correction memory devices 110 may be used to store module parity bits (or module ECC bits) which are used by an error correction code (ECC) engine or ECC circuit 152 of the controller 150 to correct errors in data read from the data memory devices 104. In some embodiments, the error correction devices 110 may be omitted and the module parity may be split into portions each of which is stored on the data devices 104 along with the data.

A module logic 112 receives commands and addresses over a command/address C/A bus from the controller 150 through a C/A terminal 114 and distributes those commands and addresses to the memory devices 104 (and 110 if present/active) over internal command and address buses (not shown). Data and module parity bits are communicated between the controller 150 and the module 102 along data buses which couple to data terminals (DQ) terminals 124 of the module 102. The data terminals 124 are organized into pseudo-channels 122 and channels 120 and 121. The channels 120 are associated with the data memory devices 104 while the channel 121 is associated with the error correction memory devices 110. Each channel 120 and 121 is a set of data terminals 124 associated with a memory device 104 (although pseudo channels and DQ terminals are only shown for one example channel 120(0)).

The module logic 112 includes a module settings register 114 which stores one or more pieces of module level information. For example, the module settings register 114 may include information about the operational settings of the module 102 and/or the memory devices 104 and 110 thereon. The module settings register 114 may operate in conjunction with memory setting registers (e.g., mode registers, fuse arrays, or combinations thereof) on the individual memory devices 104 and 110. Some registers of the module settings register 114 may be read-only, while others may be read/write. The controller 150 may perform read operations on the module settings register 114 to gather information about the operation of the module 102 and/or about a current status of the module 102. The controller 150 may perform a write operation to the module settings register 114 to change various operations of the module. In some embodiments, one or more settings of the module settings register 114 may be set based on non-volatile storage (e.g., a fuse array), which may be set, for example when the module 102 is assembled. In some embodiments, one or more settings of the module settings register 114 may be based on volatile storage (e.g., latches, memory cells, etc.) and may be set when the device is powered on.

An example register may specify the number of DQ terminals 124 per pseudo-channel 122 used for data as well as other details such as the burst length (e.g., the number of serial bits) along a given DQ terminal 124 during access operations. In some embodiments, the module 102 may include more physical DQ terminals than are used in the selected operational mode. For example, each channel 120 may include 8 physical DQ terminals, which are divided into two pseudo-channels 122 of four physical DQ terminals each. However, the module settings register 114 may specify a 2p2 mode where two DQ terminals are used for data per pseudo-channel.

In some embodiments, the error correction memory devices 110 may be an optional feature which is disabled in certain operational modes. For example, in some operational modes, the error correction memory devices 110 may be active and the module parity bits may be sent and received along the error correction channel 121 and stored in the error correction memory devices 110. In some embodiments, the error correction memory devices 110 may be disabled. In some embodiments, the error correction memory devices 110 may be omitted from the module.

Embodiments where the error correction devices 110 are omitted (or disabled) may be referred to as operating in 8×2p3 mode. For example, in an 8×2p3 module 102, there may be eight total memory devices on the module 102, data devices 104(0) to 104(7). As explained in more detail herein, in some modes the module parity bits which would have been stored on the error correction devices 110 may instead be distributed and stored in the data memory devices 104, and the module parity may be sent and received along the channels 120 associated with the data memory devices 104.

The module setting register 114 may include settings which determine how much module parity is stored on the memory devices 104. For example, the module settings register 114 (along with the individual settings of the memory devices 104) may specify how many bits of module parity are transmitted along with data for each access operation on each memory. In an example implementation, there may be two modes, a high reliability mode with a larger number of module parity bits and a high storage mode with a smaller number of module parity bits. The high reliability mode may allow the ECC circuit 152 of the controller 150 to correct a greater number of errors. The high storage mode may allow for a smaller amount of error correction, but increase how much space is available on the data devices 104 for data storage compared to the high reliability mode. The high reliability mode may mimic the amount of error correction available in a memory module with 2 error correction devices (e.g., a 10×2p2 module). The high storage mode may mimic an amount of error correction available in a module with a single error correction device (e.g., a 9×2p2 module). The high-reliability and high-capacity mode may be user selectable features. For example, a user may change whether the module 102 operates in the high-capacity or high-reliability mode by changing one or more settings of the module settings register 114, settings of the controller, settings of the individual data devices 104, or combinations thereof.

FIG. 1 shows an example memory module 102 which may be used to implement some embodiments of the present disclosure. The example module shown in FIG. 1 may be configured to operate in a variety of modes. For comparison, two optional error correction devices 110(0) and 110(1) are shown. If one or both error correction devices 110 are present, the device may operate in various 10× (two error correction devices) or 9× (one error correction device) mode, such as a 10×2p4 mode, a 10×2p2 mode, a 9×2p4 mode, or a 9×2p2 mode. Such modes may still leverage memory devices of the present disclosure which use separate addressable word line portions, especially in 2p2 modes, as described in more detail for example in FIGS. 2-7.

Since the 10× mode has two error correction devices instead of one in the 9× modes, in the 10× modes more module parity bits result in an increased amount of error correction capability. For example, in a 10×2p2 mode, the amount of module parity may allow the error correction circuit 152 to correct the information along up to 4 DQ terminals 124 of one of the channels 120. This may allow 'chipkill', or repairing the data from an entire data device 104, since in a 2p2 mode, there are four total DQ terminals used for data. In a 9×2p2 mode, the amount of module parity may allow the error correction circuit 152 to correct information along up to 2 DQ terminals.

In some embodiments of the disclosure, one or both of the optional error correction devices 110 may be omitted. For example if both error correction devices are omitted, the device may operate in an 8× mode, such as an 8×2p2 or 8×2p3 mode. Some 8× modes (e.g., 8×2p3) may take advantage of half-page modes in order to store both data and additional information on the data devices 104. The additional information may include the module parity, which may allow for the error correction circuit 152 of the controller 150 to still make corrections. In 8×2p3 modes where module parity is stored on the data devices 104, the amount of module parity may be a selectable feature. For example, a mode may be selected where the amount of module parity stored allows for the repair of up to 4 DQs of a channel (e.g., an amount which mimics the amount in a 10× mode) or a mode may be selected where the amount of module parity stored allows for the repair of up to 2 DQs of a channel (e.g., an amount which mimics the amount in a 9× mode). For the sake of discussion, the 8× mode which enables 4 DQ repair (e.g., analogous to a 10× mode) may be referred to as an 8× high-reliability mode, while the 8× mode which enables up to 2 DQ repair (e.g., analogous to a 9× mode) may be referred to as an 8× high-capacity mode.

Each channel 120(0) to 120(7) and 121 includes one or more pseudo-channels 122, which may be operated independently of each other. In the 2p2, 2p4, and 2p3 modes, each channel 120 includes two pseudo-channels 122, each of which includes four physical data terminals. In a 2p4 mode, each channel 120 includes two pseudo-channels 122 which uses four data terminals 124 for data. In a 2p2 or 2p3 mode, each pseudo-channel includes two data terminals used for data. In the 2p3 mode, an additional DQ terminal is used for additional information in parallel with the two DQ terminals used for data. The 2p2 and 2p3 modes may represent half-page modes for the individual memory devices 104, while the 2p4 mode may represent a full-page mode. The amount of data transmitted per access operation may vary between half-page and full-page modes, as described in more detail herein.

Since the memory devices and channels may generally be similar to each other, only a single device 104(0) and its associate channel 120(0) are described in detail herein. In order to simplify the layout of the figure, an arrangement of two rows of four devices 104 each is shown, and their associated channels 120 are shown as stacked boxes. However the representation of FIG. 1 does not necessarily represent the layout of a physical device. For example, a single row of 8 devices 104 may be used or four devices on a front side of a chip and four devices on a back side of the chip may be used. Similarly, various buses and signal lines have been simplified down to a single line for clarity on the drawing, however, multiple physical signal lines may be represented by a single line in the drawing.

During an example write operation, the controller 150 provides a write command and addresses (e.g., row, column, and/or bank addresses as explained in more detail herein) over the C/A terminal 114 to the module 102. The module logic 112 distributes the command and address to the data memory devices 104(0) to 104(7). The controller 150 also provides data to be written along the various DQ channels 120(0) to 120(7). The ECC circuit 152 generates parity based on the data to be written, and the module parity is also provided along the DQ channels to the module 102. The amount of module parity bits which are generated may be based on a mode of the module 102. For example in a 10× mode or an 8× high-reliability mode, a first number of module parity bits may be generated (e.g., 128 bits of module parity). In a 9× mode or an 9× high-capacity mode, a second number of module parity bits (e.g., 64 bits of module parity) may be generated which is less than the first number.

Since the pseudo-channels 122 may be operated independently, we will consider a single pseudo-channel 122 and its DQ terminals 124. Each active data terminal receives a serial burst of bits as a burst length, which together represent a codeword of data. For example, in a 2p2 mode or 2p3 mode, two active data terminals each receive 32 data bits in series (a burst length of 32 bits), for a total of 64 data bits per device and 512 bits of data per access operation across the eight data devices 104 of the module 102. In a 2p4 mode, each of four active terminals still receives 32 data bits in series. In the 2p4 mode, a different number of data devices 104 may be used per access operation, for example 5 data devices 104 may each provide 128 data bits for a total of 640 data bits across the module 102.

In embodiments where the error correction memory devices 110 are present and active (e.g., 10× and 9× modes), the module parity bits are written along the channel 121 to the error correction memory devices 110. The channel 121 may operate in a manner analogous to the channel 120. For example, in a 2p2 mode each DQ terminal receives 32 bits of module parity for a total of 64 bits per error correction device 110 or 128 module parity bits total across the module 102 in a 10× mode or 64 module parity bits in a 9× mode.

In modes where the error correction memory devices 110 are not used, such as an 8×2p3 mode, the module parity may be provided along the channels 120 and stored in the data devices 104. For example, the data may be provided along the active data terminals of a selected pseudo-channel, while the module parity may be provided along one or more additional DQ terminals of the pseudo-channel. For example data may be provided along DQ0 and DQ1 while the module parity is provided along DQ2. In some embodiments, other additional information, such as metadata, may be provided along the additional DQ terminals. The additional information may be instead of, or in addition to, the module parity bits in some embodiments.

During an example read operation in a 2p2 mode, the controller 150 provides a read command and addresses along the C/A terminal 114. The module logic 112 distributes these to the memory devices 104 to 110 and data is read out from the locations specified by the addresses. The data may be read out from the data channels 120. For example, each of the two active DQ terminals 124 in the selected pseudo-channel provides 32 bits of read data for a total of 64 data bits per device 104. The module parity is read out either from the error correction memory devices 110 along the channel 121 (e.g., in a 10×2p2 mode or 9×2p2 mode) or from the data memory devices 104 along additional DQ terminals (e.g., in an 8×2p3 mode) depending on the mode of the memory array. The ECC engine 152 of the controller 150 uses the module parity bits to check for errors and/or correct errors in the read data (and metadata if used). Similarly to the module level parity bits, in modes where metadata is used, the controller 150 may receive the metadata along additional DQ terminals of the channels 120.

In some embodiments, the module parity bits may be stored in the error correction memory devices 110 while metadata is stored in the data devices 104 and accessed along non-selected pseudo-channels. In some embodiments, both the module parity bits and the metadata are accessed along non-selected pseudo-channels. In some embodiments, module level parity may be used and metadata may be disabled or vice versa.

The access operations to the data memory devices 104 may use a single-access pass to access data and, if one or more is enabled, module parity, metadata, internal parity bits (as described in more detail herein), or combinations thereof. In an example implementation, each memory device may use multiple row drivers, each of which separately activates a different portion of a word line. For example, in a 2p2 architecture, a first row driver may activate a first half of the word line and a second row driver may activate a second half of the word line. Each word line may intersect a respective half of the column planes. Each half of the column planes may be able to access up to 72 bits of information (e.g., 64 data bits and 8 internal parity bits). As part of an access operation, the controller provides a row driver select bit or row portion select bit as part of the row address. The state of the row driver select bit indicates which row driver (and half of the column planes and pseudo-channel) are selected. In embodiments where no additional information is stored on the memory device, the non-selected row driver may remain inactive (e.g., which may save power). In embodiments where additional information is stored on the memory device (e.g., module parity and/or metadata bits) it may be stored in memory cells along the non-selected half of the word line. Accordingly, the additional information may be accessed in parallel with the data, which in turn may allow for extra information to be accessed without increasing the burst length of the data compared with modes where additional information is not enabled.

In some embodiments, each memory device 104 may also have its own separate error correction, for example an ECC circuit of the memory which can repair one or more bits of error in the codeword. For example, each memory 104 may implement single error correction (SEC) and correct up to 1 bit of error in the data (and module parity and metadata). The ECC circuits in each of the memory devices 104 may generate parity bits when the data/metadata/module parity is written, and then may use those parity bits to detect and/or correct errors. Unlike the module parity bits, the parity bits used by the on-device ECC circuits may generally stay within the devices 104, and not be read out to the controller 150.

In some embodiments, the memory devices 104 may have separately addressable portions of the memory array. Certain modes of the memory module 102 may take advantage of this feature, and accordingly, in those modes the controller 150 may generate addresses which select a portion. In an example implementation, the memory devices 104 may include separate word line portions, which are addressed based on the row address. In modes where a portion is selected, the row address may be generated with one or more additional row driver select bits which are not present in modes where a portion is not selected. For example, in a 2p4 mode, the controller may generate a row address with a first length (e.g., a first number of bits), while in the 2p2 or 2p3 modes, the controller 150 may generate the row address with a second length (e.g., the first number of bits+a number of row driver select bits). The controller 150 may provide a same length of column address in either the 2p2/2p3 mode or the 2p4 mode.

The controller 150 may have other changes in operation between other modes of the system 100. For example, if the device is in a 10× mode or a 8× high-reliability mode, the ECC circuit 152 may generate a first number of module parity bits, while if the device is in a 9× mode or an 8× high-capacity mode, the ECC circuit 152 may generate a second number of module parity bits.

The memory system 100 may operate in a number of different modes, some example modes as well as various settings associated with those modes are described in Table 1, below. A memory system 100 may be capable of being configured in some or all of the example modes of Table 1, for example by changing settings of the controller 150, module settings register 114, and/or settings of the memory devices 104 (e.g., mode registers). In some embodiments, a memory system 100 may have more or fewer modes than the modes listed in Table 1. For example, if a memory module 102 lacks error correction devices, then it may not be able to be set in the modes where error correction devices are used.

TABLE 1

| | | | | | | |
|---|---|---|---|---|---|---|
| | | | | Example Modes for a Memory System | | |
| MODE | Half-Page? | Row driver select bit? | Activated Row Portions | Module Error Correction | Error Correction Devices | Data Device Storage |
| 10 × 2p4 | No | No | 2 | Chipkill | 2 | Data, (metadata) |
| 10 × 2p2 | Yes | Yes | 1 | Partial | 2 | Data, (metadata) |
| 9 × 2p4 | No | No | 2 | Chipkill | 1 | Data, (metadata) |
| 9 × 2p2 | Yes | Yes | 1 | Partial | 1 | Data, (metadata) |
| 8 × 2p2 | Yes | Yes | 1 | N/A | 0 | Data |
| 8 × 2p3 High-Reliability | Yes | Yes | 2 | Chipkill | 0 | Data, module parity, (metadata) |
| 8 × 2p3 High-Capacity | Yes | Yes | 2 | Partial | 0 | Data, module parity, (metadata) |
| 8 × 2p3 | Yes | Yes | 2 | N/A | 0 | Data, |

TABLE 1-continued

| | | | Activated | Module | Error | |
| | Half- | Row driver | Row | Error | Correction | Data Device |
| MODE | Page? | select bit? | Portions | Correction | Devices | Storage |
|---|---|---|---|---|---|---|
| (metadata only) | | | | | | metadata |

Table 1 shows a variety of example modes, along with some example details about how they might be implemented. For example, Table 1 discusses an implementation where a row driver select bit can be used to select one or both halves of a word line in the data devices. Other examples may use other methods to select portions of the memory array (e.g., using a column plane select bit). The table shows a column for whether the various discussed modes are half-page modes or not (the modes marked as non-half-page may be full-page modes). Table 1 also shows a column for whether a row driver select bit is used. Where the row driver select bit is used, the row address may be longer than when it is not used. The activated row portions column shows whether only the portion of the column plane selected by the row driver select bit is activated or whether both portions are activated.

Table 1 also shows several columns related to module level error correction. The column 'module error correction' shows examples of the level of error correction that the error correction circuit 152 may perform. For example, in some modes, the error correction circuit 152 may be capable of 'chipkill' where the data (and metadata) from an entire data device 104 may be corrected, while in some modes the error correction circuit 152 may be capable of partial correction of the data (and metadata) from one of the data devices 104. A column is shown which represents how many error correction devices 110 are used. In some embodiments, the column may represent how many error correction devices are enabled, and in some embodiments, the column may represent how many error correction devices are physically present on the module 102.

The final column shows the information which is stored on the data devices 104. The information shown includes data, metadata, and module parity. When the metadata is shown in parenthesis as '(metadata)' it indicates that metadata may be enabled or disabled in that mode as an optional feature. In the half-page modes, such as the 2p2 and 2p3 modes, the additional information such as the module parity and/or metadata (if enabled) may be accessed as part of a single access pass, for example by storing the additional information along the non-selected portion of the word line. In the full-page modes, such as the 2p4 modes, the metadata (if enabled) may be accessed as part of a two-pass architecture, for example by saving the additional information along a second word line.

Figure 2:
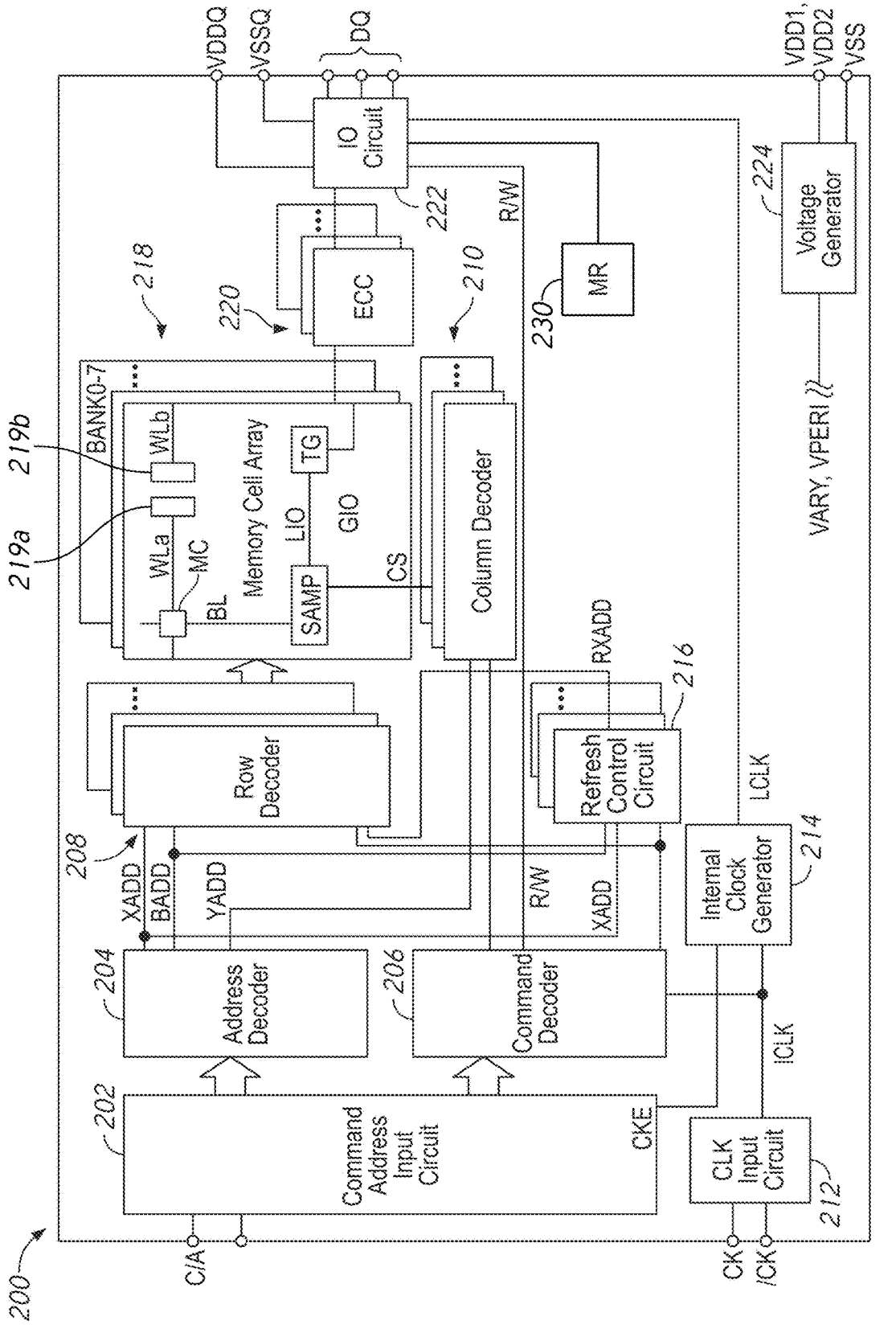
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. For example, the device 100 may implement one of the devices 204 of the module 202 of FIG. 2. In some embodiments, the memory device 200 may be a stand-alone device which is not packaged as part of a memory module. The memory device 200 may operate in various modes, such as a half-page mode (e.g., a 2p2 or 2p3 mode) or a full-page mode (e.g., a 2p4 mode).

The semiconductor device 200 includes a memory array 218. The memory array 218 is shown as including a plurality of memory banks. In the embodiment of FIG. 2, the memory array 218 is shown as including eight memory banks BANK0-BANK7. More or fewer banks may be included in the memory array 218 of other embodiments.

Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 210. In the embodiment of FIG. 2, the row decoder 208 includes a respective row decoder for each memory bank and the column decoder 210 includes a respective column decoder for each memory bank.

The bit lines BL are coupled to a respective sense amplifier (SAMP). During an access operation, the word line is activated by a word line or row driver 219. When the word line is active, data from the memory cells along the active word line is coupled to the bit lines BL and amplified by the sense amplifier SAMP. Selected bit lines (and the memory cells at the intersecting active word line) are accessed by being coupled through local input/output (LIO) lines through transfer gates (TG) to global input/output (GIO) lines to the error correction code (ECC) circuit 220 and input/output circuits 222. The bit lines are selected based on a column select (CS) signal provided by the column decoder 210 responsive to the column address.

The semiconductor device 200 may employ a plurality of external terminals, such as pins or solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ. The external terminals may couple directly to the controller (e.g., 150 of FIG. 1) and/or may couple to various buses/connectors of the module (e.g., 102 of FIG. 1).

The clock terminals are supplied with external clocks CK and/CK that are provided to an input circuit 212. The external clocks may be complementary. The input circuit 212 generates an internal clock ICLK based on the CK and/CK clocks. The ICLK clock is provided to the command decoder 206 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data. The input/output circuit 222 may include a number of interface connections, each of which may be couplable to one of the DQ pads (e.g., the solder pads which may act as external connections to the device 200).

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The decoded row address XADD may be used to determine which row should be opened (e.g., which word line should be activated), which may cause the data along the bit lines to be read out along the bit lines. The column decoder 210 may provide a column select signal CS based on the decoded column address YADD, which may be used to determine which sense amplifiers are coupled to the LIO. The address decoder 204 may also supply a decoded bank address BADD, which may indicate the bank of the memory array 218 containing the decoded row address XADD and column address YADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 202. The command decoder 206 includes circuits to decode the internal command signals to generate various internal signals and commands for performing operations. For example, the command decoder 206 may provide signals which indicate if data is to be read, written, etc.

The device 200 may receive an access command which is a write command. When the write command is received, and a bank address, a row address and a column address are timely supplied with the write command, write data and metadata supplied to the data terminals DQ by the controller is provided along the data bus and written to memory cells in the memory array 218 corresponding to the row address and column address. The write command is received by the command decoder 206, which provides internal commands so that the write data along with metadata is received by data receivers in the input/output circuit 222. The write data is supplied via the input/output circuit 222 to the ECC circuit 220 (along with additional information such as metadata and/or module ECC bits if enabled). The ECC circuit generates parity bits based on the received data (and additional information) and the ECC circuit 120 provides the data (and additional information) and parity to the memory array 218 to be written along a word line specified by the row address to memory cells specified by the column address.

The device 200 may receive an access command which is a read command. When a read command is received, and a bank address, a row address and a column address are timely supplied with the read command, read data is read from memory cells in the memory array 218 corresponding to the row address and column address. The read command is received by the command decoder 206, which provides internal commands so that read data (and additional information) along with the associated parity bits from the memory array 218 is provided to the ECC circuit 220. The corrected read data (and additional bits) is provided along the data bus, and the data (and additional information) are output to outside from the data terminals DQ via the input/output circuit 222.

When a word line is activated, all of the memory cells along the active word line are activated and the data is amplified by the sense amplifier along the bit line intersecting the memory cell and the active word line. The number of memory cells activated along the word line may be referred to as a 'page'. In an example implementation, there may be 8,192 or '8 k' memory cells in a page (e.g., a page size of 8 k). Of that full page, up to 128 bits may be simultaneously accessed (e.g., 8 bits each from 16 column planes). In some embodiments, the page size may not account for additional memory cells used for parity bits storage. In some embodiments of the present disclosure, in certain operational modes less than a full page may be accessed during an access operation. Other sizes of the page may be used in other example embodiments.

For example, each word line of the array 218 may be divided into multiple portions, each of which may be selectively activated by a respective row driver 219. In the example of FIG. 2, two portions are shown, WLa and WLb, each of which has a respective driver 219a and 219b. The row decoder 208 may selectively activate one or both of the portions based on a mode of the device 200 and one or more row driver select bits of the row address XADD. In an example full-page mode, both of the row drivers 219a and 219b are activated and both portions of the word line are activated (e.g., for a page size of 8 k). In a half-page mode, only one of the two row drivers 219a or 219b is activated, and half of the memory cells are accessed (e.g., a page size of 4 k). The number of DQ terminals which are used for data transmission may influence whether half- or full-page modes may be used. For example, in a 2p4 or ×8 mode, only a full-page access may be selected. In a 2p2 or ×4 mode, either a full-page or half-page access may be selected (e.g., based on settings in the mode register 230).

In an example full-page mode the two portions may be activated together and the row driver select bits may be omitted from the row address, and the row address may be used to determine which pair of row drivers 219a and 219b are activated. In an example half-page mode the two portions may be separately addressed, and the row address (without the row driver select bits) is used to determine which word line activates while the row driver select bit determines which portion of that word line is activated (e.g., either 219a or 219b). Accordingly, depending on the operational mode, the length (e.g., number of bits) of the row address XADD may change. The column address YADD may remain a same length between the operational modes.

In some operational modes, a 'half-page' access may be performed with respect to the amount of data which is accessed, but additional information may still be retrieved from the non-selected half of the page. For example, in a mode such as an 8×2p3 mode, the row driver select bit of the row address may still be used to select one half or the other of the word line. However, both halves may still be activated, with data being accessed in the selected half (e.g., the half indicated by the row driver select bit) while additional information (e.g., module parity, metadata, or combinations thereof) is accessed in the non-selected half (e.g., the half which is not indicated by the row driver select bit).

The device 200 includes refresh control circuits 216 each associated with a bank of the memory array 218. Each refresh control circuit 216 may determine when to perform a refresh operation on the associated bank. The refresh control circuit 216 provides a refresh address RXADD (along with one or more refresh signals, not shown in FIG. 1). The row decoder 208 performs a refresh operation on one or more word lines associated with RXADD. The refresh control circuit 216 may perform multiple types of refresh operation, which may determine how the address RXADD is generated, as well as other details such as how many word lines are associated with the address RXADD.

The ECC circuit 220 may detect and/or correct errors in the accessed data. As part of a write operation, the ECC circuit 220 may receive bits from the IO circuit 222 and generate parity bits based on those received bits. The parity bits generated by the ECC circuit 220 may be separate from the module parity bits from the ECC circuit 152, although the parity bits may be generated based, in part, on the module parity bits. The received bits and parity bits are written to the memory array 218. During an example read operation, the ECC circuit 220 receives a set of bits and their associated parity bits from the array 218 and uses them to locate and/or correct errors. For example, in a single error correction (SEC) scheme, up to one bit of error may be located and detected. In a single error correction double error detection (SECDED) scheme, up to one bit of error may be corrected, but two errors may be detected (although the bits causing those errors are not individually located, so no correction can be made). The ECC circuit 220 may correct the information and then provide the corrected information (and/or a signal indicated detected errors) to the IO circuit 222. The parity bits may generally not be provided to the IO circuit 222.

The mode register 230 may include various settings, and may be used to enable the various optional modes of the device. For example the mode register 230 may include settings which specify a number of DQ terminals and whether half- or full-page accesses are performed. The memory 200 may be operated in various modes based on a number of the DQ pads which are used. In some embodiments, the mode register 230 may include settings which determine how many DQ pads are used, even if there are more DQ pads available. The mode may determine both how many DQ pads the controller expects to send/receive data along, as well as the format and/or number of bits which the controller expects as part of a single access command. For example, the memory may have 16 physical DQ pads. In a 2p2 mode, four of those DQ pads are used, divided into two pseudo-channels of two DQ pads each. In a 2p4 mode, eight of those DQ pads are used, divided into two pseudo-channels of four DQ pads each. The mode register 230 may also include settings which determine a burst length at each DQ terminal as part of an access operation. The burst length represents a number of serial bits at each DQ terminal during an access operation. In some embodiments, the burst length may not change between modes. For example both the 2p2 and 2p4 modes may use a burst length of 32 bits per DQ terminal.

The mode register 130 may include one or more registers which specify whether the device is in a half-page or full page mode. For example, when the device is in a 2p2 mode, the register may specify whether to activate one portion of the word line or multiple portions. The device may also include registers enable the storage of additional information (e.g., module parity bits and/or metadata) on the memory device 200. For example the mode register may include one or more additional information registers which may include settings such as whether the additional information is enabled, how many bits of additional information are enabled, and/or how the additional information should be stored. For example, in a half-page mode, the register 230 may specify that data should be stored in memory cells along the word line portion specified by the row driver select bit, while the additional information should be stored in memory cells along the word line portion which is not selected by the row driver select bit. In a half-page mode, when additional information is enabled, both row drivers 219a and 219b may be activated together (e.g., analogous to a full-page mode) and rather than determining which row driver is activated, the row driver select bit(s) of the row address determines which portion is selected to store the data and which portion is used to store the additional information.

The power supply terminals are supplied with power supply potentials VDD and VSS. The power supply potentials VDD and VSS are supplied to an internal voltage generator circuit 224. The internal voltage generator circuit 224 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 3:
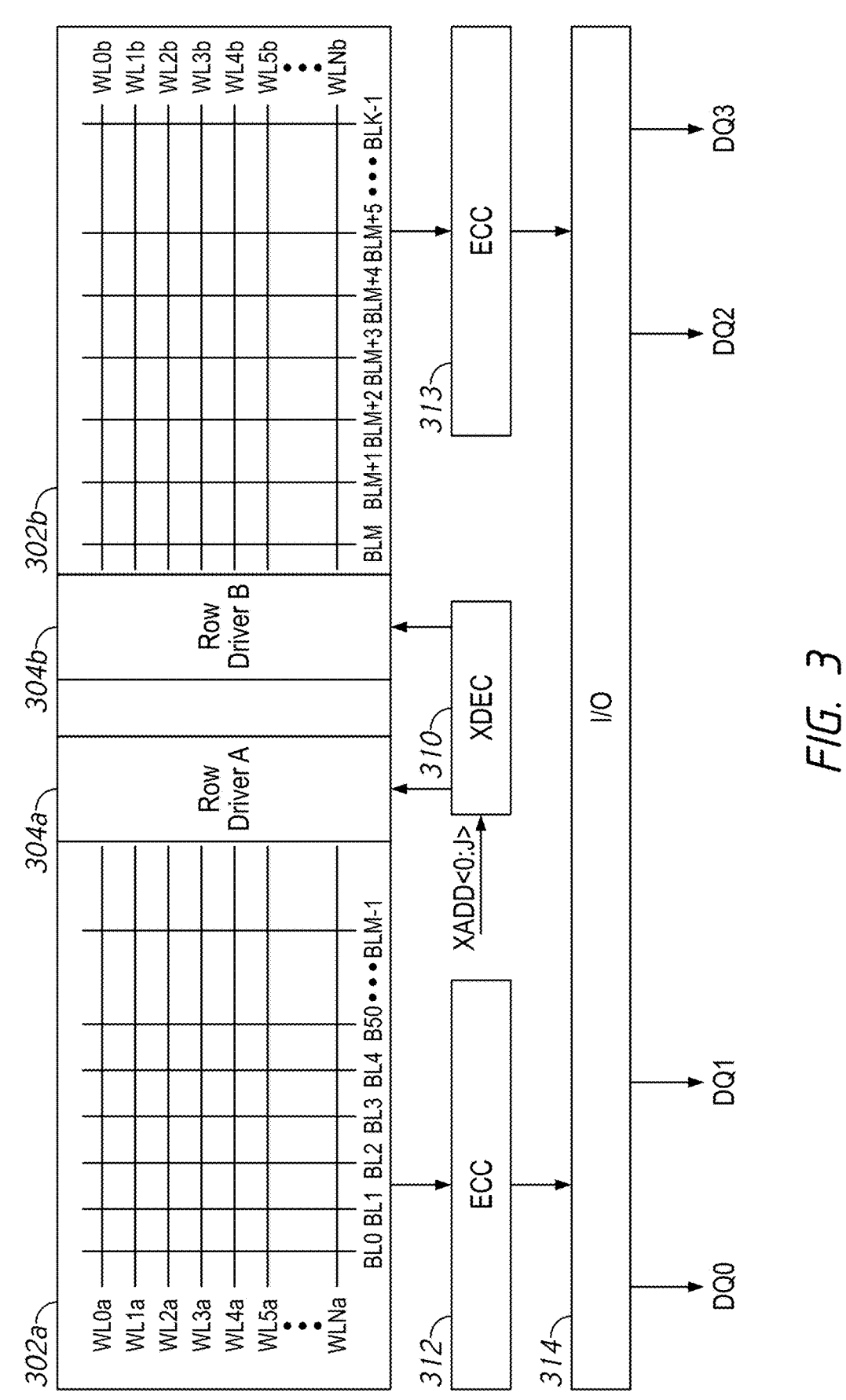
FIG. 3 is a block diagram of a memory device according to some embodiments of the present disclosure.

FIG. 3 is a block diagram of a memory array with separately addressed row drivers according to some embodiments of the present disclosure. FIG. 3 shows a portion of a memory device 300 which may, in some embodiments, be included in a memory device such as 104 and/or 110 of FIGS. 1 and/or 200 of FIG. 2. FIG. 3 shows an example memory array 300 where each word line is split into two portions, each of which may be separately activated by a respective row driver 304 in a half-page mode or which may be activated together in a full-page mode. More portions and row drivers may be used in other example embodiments. The view of FIG. 3 shows various components useful to describe the operation and selection of the separate word line portions. Certain other components such as the column decoder, address decoder, command decoder, etc. are omitted from the view of FIG. 3.

The memory device 300 shows an example memory device which may be used for half-page or full-page modes, such as 2p4, 2p2, and/or 2p3 modes. There are four DQ terminals (e.g., in a pseudo-channel such as 122 of FIG. 1), organized into two pairs, a first pair DQ0 and DQ1 and a second pair DQ2 and DQ3. Other organizations of the DQ terminals (e.g., DQ0/DQ2 and DQ1/DQ3) may be used in other example embodiments. In half-page modes such as 2p2 and 2p3, either the first pair or the second pair is used for data bits. The memory device 300 may, in some embodiments, also operate in a 2p4 operational mode, where all four DQ terminals are used for data.

The memory array 302 includes a number of word lines WL and bit lines BL with memory cells disposed at the intersection of the word lines and bit lines. The word lines and bit lines may be formed from conductive elements. Each of the word lines is associated with a row address XADD and each of the bit lines is associated with a column address YADD. The memory array 302 is divided into two portions 302a and 302b. Each portion includes a number of word line portions and bit lines and a corresponding number of memory cells. The word line may be divided into two portions, with a first portion of the word line in a first portion of the array 302a, and a second portion of the word line in a second portion of the array 302b. For example, the first portion 302a includes word line portions WL0a to WLNa and bit lines BL0 to BLM−1, while the second portion 302b includes word line portions WL0b to WLNb and bit lines BLM to BLK−1. In some embodiments, the number of bit lines (and thus the number of memory cells) may be equal in the two portions of the memory array 302a and 302b.

The word line portions WLa in the first portion 302a of the memory array are couple to respective row drivers 304a. The word line portions WLb in the second portion 302b of the memory array are coupled to respective row drivers 304b. The two portions may each be separate conductive elements, which are not electrically coupled. The two word line portions may be separately activated from each other. For example, the portion WL0a may be active while the portion WL0b remains inactive. A row decoder 310 (e.g., 208 of FIG. 2) receives a row address XADD and selects which word line and which portion of the word line to activate based on the row address and the mode. In some modes (e.g., as set by a mode register such as 230 of FIG. 2) such as a full-page mode, both portions may be activated together responsive to the row address.

In some modes, such as a half-page mode, one portion of the word line may be activated and used to stored data, while the other portion may remain inactive (or activated and used for additional information as described in more detail herein). In a half-page mode, the row decoder 310 receives a row address XADD which includes a row driver select bit. In the example of FIG. 3, the row driver select bit is a final bit of the row address, however over positions of the row driver select bit in the row address may be used in other example embodiments. Based on a state of the row driver select bit, the row decoder 310 provides decoded row address signals to either the first set of row drivers 304a or the second set of row drivers 304b. A remainder of the row address is used to determine which row driver is activated within the set. For example, if the row address is a J+1 bit address (e.g., XADD<0: J>) then one of those bits acts as the row driver select bit and the remaining J bits (e.g., XADD<0: J−1>) are used to determine which row driver and word line are activated. Accordingly, the row address may be J bits long in a full-page mode (e.g., XADD<0: J−1>) and J+1 bits long in a half-page mode (e.g., XADD<0: J>).

A column decoder may provide a column select signal CS, which selects which bit lines are accessed, in common to both of the memory array portions 302a and 302b. Similarly, the decoder portion of the row address which does not include the row driver select bit may be shared between both portions. In some embodiments, the column select signal may be separately provided to each half, in order to allow for different bit lines to be accessed if both halves are accessed (e.g., during a half-page mode where additional information is stored in the non-selected half). In general, the row driver select bit determines which portion of the word line is active, while the remainder of the row address and the column address determine which memory cells are accessed in that portion.

Each memory array portion 302a and 302b is coupled to a respective error correction code (ECC) circuit 312 and 313 (e.g., 220 of FIG. 2) and through the respective ECC circuit to an I/O circuit 314 (e.g., 222 of FIG. 2) and DQ terminals. The ECC circuit 312 may use parity bits stored in the memory array portion 302a to locate and correct errors in the data stored in the memory cells of the of the portion 302a. Similarly, the ECC circuit 313 may use parity bits stored in the memory array portion 302b to locate and correct errors in the data stored in the memory cells of the of the portion 302b. In this manner, data (and additional information) may have on-die error correction even in a half-page mode.

In some embodiments, in a half-page mode where additional information is enabled, data may be stored in a selected portion, while additional information associated with that data (e.g., module parity and/or metadata bits) is stored in the non-selected portion. The state of the row driver select bit may determine which portion is selected and which portion is non-selected. For example, if the row driver select bit is in a first state, then data may be stored in the first portion 302a along a first portion of the selected word line WLa, while the additional information is stored in the second (non-selected) portion 302b along a second portion of the word line WLb. Similarly, if the row driver select bit is in a second state, then data may be stored in portion 302b, while additional information is stored in 302a.

When data is associated with additional information stored in the non-selected portion of the array, the ECC circuit associated with the selected portion may be used for both the data and the additional information. For example, during a write operation if the row driver select bit indicates the first portion 302a, then the I/O circuit 314 provides the data and the additional data to the first ECC circuit 312, which generates parity based on the data and additional information. The data and parity is written to memory cells in the selected first portion 302a, while the additional information is written to memory cells in the non-selected portion 302b.

Figure 4:
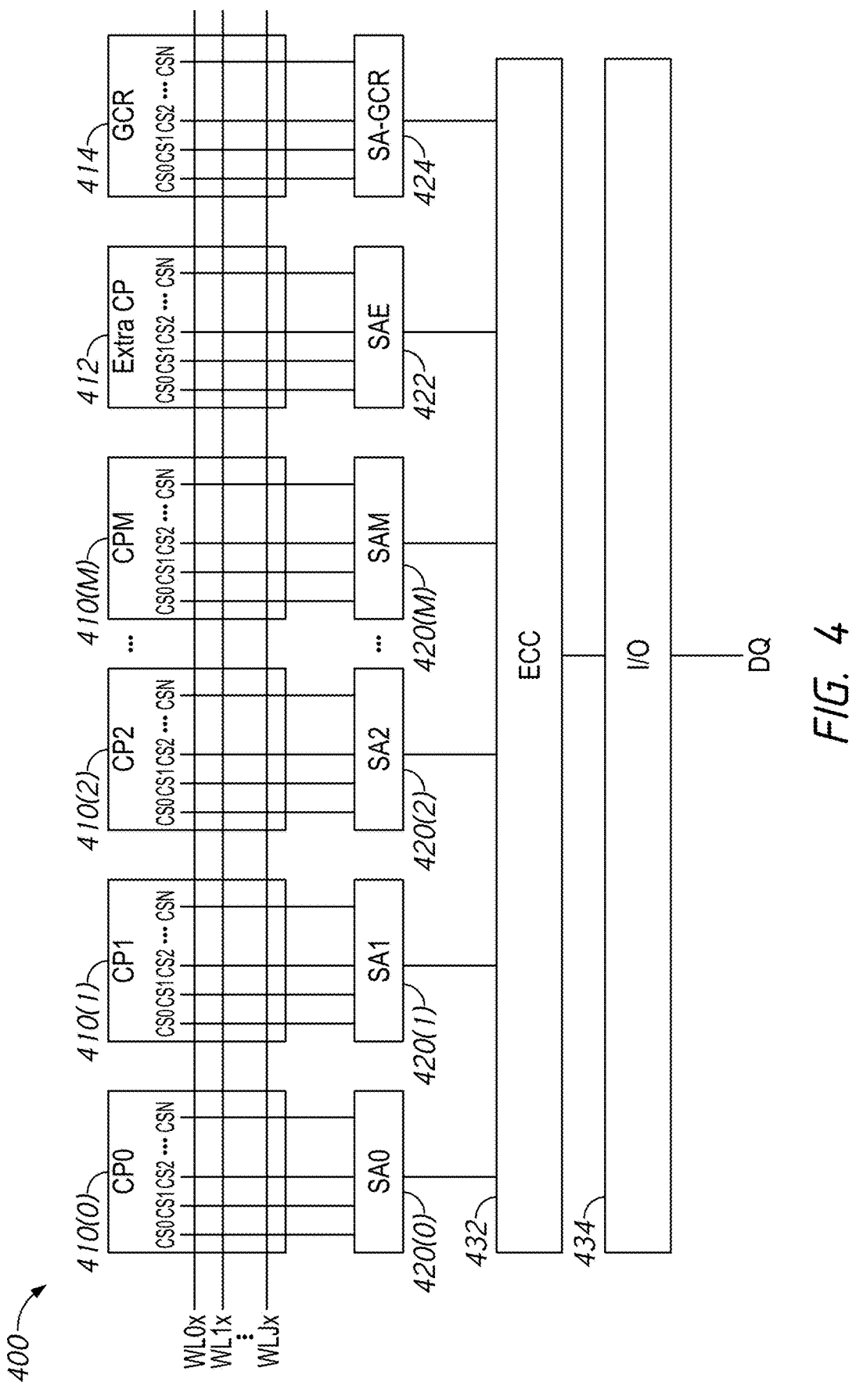
FIG. 4 is a block diagram of a portion of a memory device according to some embodiments of the present disclosure.

FIG. 4 is a block diagram of a portion of a memory device according to some embodiments of the present disclosure. The memory device 400 may, in some embodiments, represent a portion of one of the memory devices 104 and/or 110 of Figure, the memory device 200 of FIG. 2, and/or 300 of FIG. 3. The view of FIG. 4 shows one portion of a memory array, which may, in some embodiments implement one of the portions 302a or 302b of FIG. 3. The view of FIG. 4 shows an example organization of half of the memory array including word line portions WLx (which may be either WLa or WLb of FIG. 3) and their intersection with bit lines organized into column planes. The components of FIG. 4 may be repeated for a second half of the memory array.

The memory device 400 is organized into a number of column planes 410-414. Each of the column planes represents a portion of a memory bank. Each column plane 410-414 includes a number of memory cells at the intersection of a word line portion WL and bit lines. The bit lines may be grouped together into sets which are activated by a value of a column select (CS) signal. For the sake of clarity, only a single vertical line is used to represent the bit lines of each column select set, however, there may be multiple columns accessed by that value of CS. For example, each line may represent 8 bit lines, all accessed in common by a value of CS. As used herein, a 'value' of CS may refer to a decoded signal provided to sets of bit lines. So a first value may represent a first value of a multibit CS signal, or after decoding a signal line associated with that value being active. The word line portion WLx may be extend across multiple of the column planes 410-414.

The memory 400 includes a set of data column planes 410 as well as an extra column plane 412. The extra column plane 412 may be used to store additional information, such as parity bits used by the ECC circuit 442.

In some embodiments, the memory 400 may also include an optional global column redundancy (GCR) column plane 414. In some embodiments, the GCR plane 414 may have fewer memory cells (e.g., fewer column select groups) than the data column planes 410. The GCR CP 414 includes a number of redundant columns which may be used as part of a repair operation. If a value of the CS signal is identified as including defective memory cells in one of the data column planes 410, then the memory may be remapped such that the data which would have been stored in that column plane for that value of CS is instead stored in the GCR CP 414.

In an example embodiment, the memory 400 may include 8 data column planes 410(0)-410(7). Each of those data column planes 410 includes 64 sets of column selects activated by a value of the column select signal, and each set of column select includes 8 bit lines. Accordingly, when a word line is opened responsive to a row address, and a column select signal is provided to each of the 8 column planes then 8 bits are accessed from each of the 8 column planes for a total of 64 bits from this memory array portion. If both word line portions are active then 128 bits are accessed. A column select signal is also provided to the extra column plane 412, although that column select signal may be a different value than the one provided to the data column planes 410 for an additional 8 bits (e.g., 8 bits of parity). If a repair has been performed, the GCR CP 414 may also be accessed and the value on a GCR LIO may be used while ignoring the LIO of the column plane it is replacing.

In an example write operation, a controller (e.g., 150 of FIG. 1) provides data and, if enabled additional information to the memory device which are written as part of a single access pass. If the memory array portion 400 represents the selected portion, then the controller provides data bits along the DQ terminals. In the example embodiment of a 2p2 architecture, the data may be provided along two DQ terminals as a 32 bit long burst length. The data is provided to the ECC circuit 432 which generates a set of parity bits based on the data bits. For example 8 parity bits may be generated based on the 64 data bits. Based on the column address a value of the CS signal is provided to the column planes 410 and the data is written to the data column planes. A column select signal (which may be the same or different) is provided to the extra column plane 412 and the parity is written to the to the selected half of the column planes and provide a second value of the CS signal to the non-selected half of the column planes.

In modes where additional information is enabled, then as part of the write operation described above, while the DQ terminals associated with the selected portion (e.g., as selected by the row driver select bit) are receiving the data, then one or more additional DQ terminals may receive additional information. The additional information may be received in parallel to the data being received along the selected DQ terminals. For example, if the data is received in a burst length of 32 bits along both a first and a second DQ terminal, then the additional information may be received along a third and/or fourth DQ terminal. In some embodiments, there may be fewer bits of additional information than there are data bits. In some embodiments, there may be fewer bits of additional information than a burst length of the data (e.g., less than 32 bits). In some embodiments, the burst length along the additional DQ terminal may be matched to the burst length used by the data by adding 'junk' bits to the additional information which are not latched by the I/O circuit (or which are otherwise ignored/discarded). For example, the first two DQ terminals may each receive 32 bits of data while the third DQ terminal receives 16 bits of additional information and 16 bits of junk.

The additional bits are provided to the same ECC circuit (e.g., 432) as the data bits, and the parity bits are generated based on both the data and additional bits. For example, if the additional information includes 16 bits of module parity (e.g., in an 8× high-reliability mode), then the ECC circuit 432 receives 80 bits, 64 data bits and 16 module parity bits, and generates 8 bits of parity based on those 80 bits. The data is written to the column planes 410 and the parity is written to the extra column plane 412 of the selected portion. The additional information is written to memory cells of the non-selected portion. Both portions of the word line portion are activated, and in the portion not selected by the value of the row driver select bit, the additional information is written to one or more column planes specified by a value of CS which is generated based on the column address. The value of CS used in the non-selected column plane may be different than the value used for the selected portion. The value used for the non-selected portion may be based on internal mapping and may use CS values which are set aside for storing additional information, and thus not directly addressable by the controller.

In an example read operation, the controller provides a row and column address along with a read command. Based on a row driver select bit of the row address, the portion 400 is selected. The remainder of the row address is used to select which word line portion is activated and a value of CS is provided based on the column address. The data is read out from the data column planes 410 and the parity is read out from the extra column plane 412 through the sense amplifiers 420 and 422 to the ECC circuit 432. The ECC circuit 432 performs error correction on the data based on the parity. The ECC circuit may perform different levels of error detection/correction depending on the embodiment and the implementation, such as single error correction (SEC), SEC double error detection (SECDED) or other forms of error correction. The ECC circuit provides the corrected data to the I/O circuit 434, which provides the data to the DQ terminals. For example, a burst of 32 bits of data across 2 DQ terminals is provided.

In embodiments where additional information is enabled, then as part of the same example read operation, the additional information is retrieved from the non-selected portion. In an analogous fashion to the write operation, the second (non-selected) portion of the word line is also accessed based on the row address and a CS signal is provided (which may be different than the value of the CS signal used in the selected portion). The additional information is read out from the selected column planes of the non-selected portion to the ECC circuit 432 of the selected portion. The data and parity read out from the selected portion is combined with the additional information, and the ECC circuit detects/corrects errors in the combined data, and additional information based on the parity. For example, the ECC circuit 432 may receive 88 bits, 64 data bits, 16 bits of additional information (e.g., module parity in a 8× high-reliability mode) and 8 parity bits. The ECC circuit 432 may then correct/detect errors in the data and additional information based on the parity. The corrected data is provided through the I/O circuit 434 to the DQ terminals associated with the selected portion while the corrected additional information is provided through the I/O circuit 434 to the DQ terminals associated with the non-selected portion. The data is provided in a burst along the selected DQ terminals while the additional information is provided in a burst in parallel along one or more of the non-selected DQ terminals. If necessary the I/O circuit may provide one or more bits of junk data to match burst lengths.

Different amounts of additional information may be stored in different example modes. For example, the in an 8× high-reliability mode 16 bits of module parity may be stored on the device. In an 8× high-capacity mode, 8 bits of module parity may be stored on the device. If metadata is enabled, then 2, 4, 8, or 16 bits of metadata may also be stored. More or fewer bits of module parity and/or metadata may be used in other example embodiments.

Figure 5:
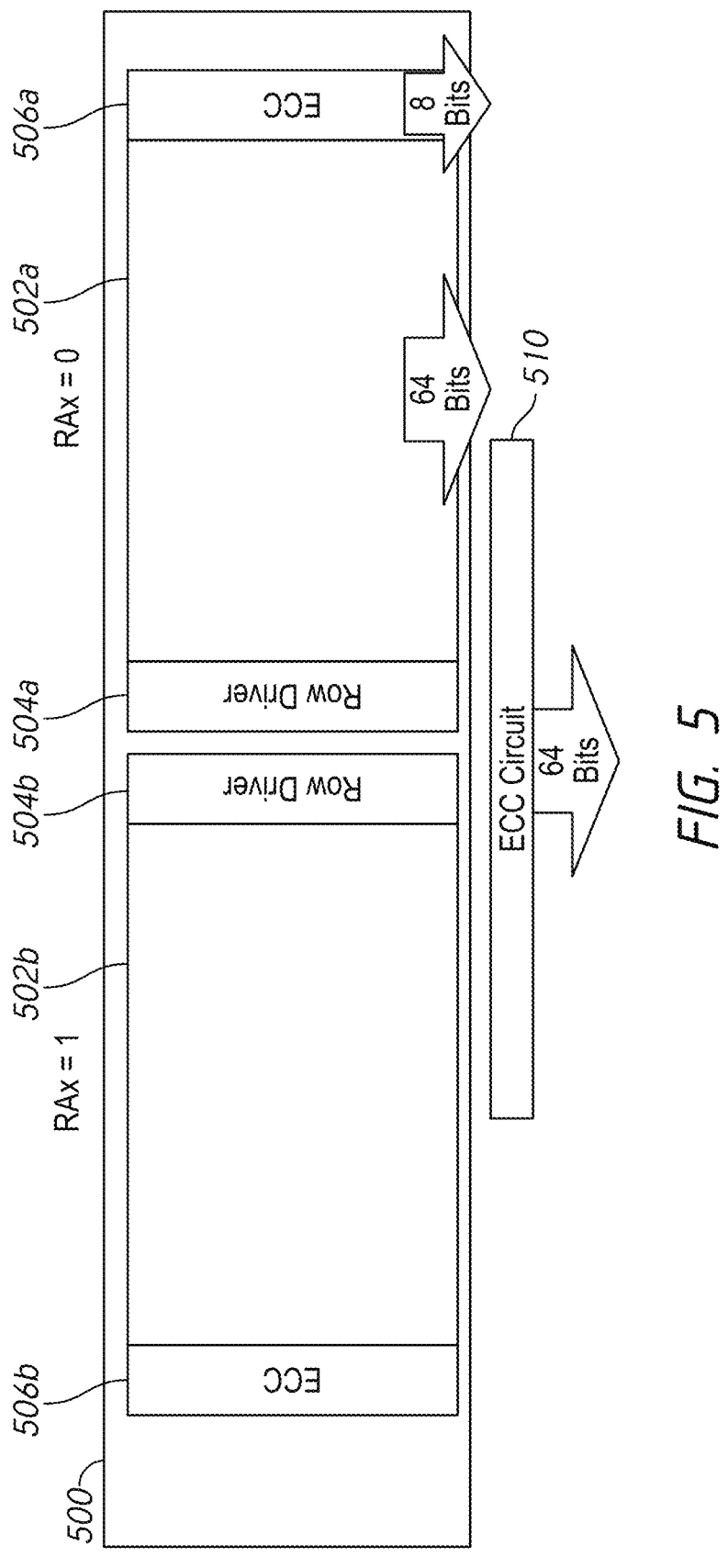
FIG. 5 is a block diagram of information storage in a memory array operating in a half-page mode with no additional information according to some embodiments of the present disclosure.

FIG. 5 is a block diagram of information storage in a memory array operating in a half-page mode according to some embodiments of the present disclosure. The memory array 500 of FIG. 5 shows an example of how data and its associated parity may be stored in a memory array where the word line portions are separately addressable (e.g., the memory array 218 of FIG. 2, and/or the portions 302 of FIG. 3). In particular, FIG. 5 shows an embodiment where no additional information is stored. For example, additional information may be disabled in a mode register (e.g., 230 of FIG. 2) and/or module settings register (e.g., 114 of FIG. 1). The example of FIG. 5 may represent the operation of a memory device on a module operating in a 10×2p2 or 9×2p2 mode in some embodiments.

FIG. 5 shows an example implementation where the memory array 500 is divided into two portions 502a and 502b (e.g., 302a and 302b of FIG. 3), each of which includes a number of data column planes (e.g., 410 of FIG. 4) and a respective extra column plane 506a and 506b (e.g., 412 of FIG. 4). Each portion has separately addressed row drivers 504a and 504b. In the implementation of FIG. 5, each portion 502a and 502b includes 8 data column planes, each of which provides 8 bits when accessed as well as an extra column plane 506a and 506b respectively used to store parity.

During an example write operation, the memory receives a row address which includes a row driver select bit RAx. In this example, the RAx bit has a value of 0. The memory also receives data along DQ terminals (not shown). Since this is a 2p2 mode, the data is received in two bursts along two DQ terminals. For example each DQ terminal may receive a burst length of 32 bits (e.g., 64 bits total). The ECC circuit 510 receives the data bits (e.g., 64 bits) and generates parity based on those data bits. For example 8 parity bits may be generated. Since the value of RAx is 0, the first portion 502a is selected, and the row driver 504a activates the half of the word line (specified by the remaining bits of the row address) which extends into the first portion 502a. The data bits are written to the memory cells at the intersection of the active portion of the word line and the bit lines selected by a column select signal based on the row address. The parity bits are written to the extra column plane 506a in the selected portion, at the intersection of memory cells along the active portion of the word line and bit lines selected by a column select signal (which may be the same or different than the column select signal provided to the rest of the portion).

During an example read operation, the memory receives a row address including RAx. Based on the value of RAx, one of the portions is selected, and the portion selected by RAx of the word line selected by a remainder of the row address is activated by the row driver 504a. The data is read from the memory cells along the active word line which are associated with a value of CS based on the column address, and the parity bits are read from the extra column plane 506a. The ECC circuit 510 may detect and/or correct errors in the data based on the parity and provide the corrected data to the DQ terminals. In the 2p2 mode, the 64 bits of corrected data are provided in two burst lengths of 32 bits along two DQ terminals.

FIG. 6 is a flow chart of a method of writing data in a half-page mode according to some embodiments of the present disclosure. The method 600 may be performed by one or more of the apparatuses or systems described herein. For example in some embodiments the method 600 may be performed by the memory devices 104 and/or 110 of FIG. 1, 200 of FIG. 2, 300 of FIG. 3, 400 of FIG. 4, and/or 500 of FIG. 5. The method 600 is described with respect with a 2p2 half-page mode, however the half-page mode may be used with other DQ terminal settings.

The method 600 represents the operation of a memory device in a half-page mode without additional information. In some embodiments, the method 600 may include setting the device into a half-page mode. For example the method 600 may include writing to a register of module settings register (e.g., 114) and/or mode register (e.g., 230 of FIG. 2) to set the memory devices into a half-page mode. In some embodiments, the controller (e.g., 150) may write to the register.

The method 600 may begin with box 610, which describes receiving a plurality of data bits and a row address as part of a write operation. The method 600 may also include receiving a column address and a write command as part of the write operation. The method 600 may include receiving the data bits along a pair of DQ terminals and receiving the row address, column address, and write command along one or more command/address terminal.

Box 610 may be followed by box 620 which describes selecting a first portion or a second portion of a word line based on a row driver select bit of the row address. The selecting may be based on a state of the row driver select bit. The method 600 may include selecting one of a plurality of word lines based on a remainder of the row address (e.g., the portion of the row address excluding the row driver select bit) and selecting a portion of the selected word line based on the row driver select bit.

Box 620 is followed by box 630, which describes activating the selected first portion or second portion of the word line. For example, the method 600 may include activating a row driver associated with the first portion or the second portion.

In an example implementation where there are two portions of the word line, the method 610 may include activating a first row driver (e.g., 219a of FIGS. 2 and/or 304a of FIG. 3) associated with the first portion (e.g., WLa of FIGS. 2 and/or 302a of FIG. 3) responsive to the row driver select bit having a first value or activating a second row driver (e.g., 219b of FIGS. 2 and/or 304b of FIG. 3) associated with the second portion (e.g., WLb of FIGS. 2 and/or 302b of FIG. 3) responsive to the row driver select bit having a second value. In some embodiments, the method 600 may include activating a first half of the memory cells along the word line but not a second half of the memory cells along the word line when the row driver select bit is in the first state or activating a second half of the memory cells along the word line but not the first half of the memory cells along the word line when the row driver select bit is in the second state.

The method 600 may include generating the row address with the row driver select bit as an additional bit with the controller when the device is in the half-page mode. The method 600 may also include generating the row address without the row driver select bit with the controller when the device is not in the half-page mode. For example, the method 600 may include generating a row address with a first number of bits with the controller when the device is in the half-page mode and generating the row address with a second number of bits with the controller when the device is not in the half-page mode. The first number of bits may be greater than the second number of bits. The method 600 may include generating a column address with a same number of bits in the half-page mode and in a non-half-page mode.

Box 630 may be followed by box 640, which describes writing the plurality of data bits to the activated selected first portion or second portion of the word line. The method 600 may include writing the data to memory cells along the first portion but not the second portion if the first portion is selected, or writing the data to memory cells along the second portion but not the first portion if the second portion is selected. The method 600 may include generating a column select signal based on the column address with a column decoder (e.g., 210 of FIG. 2) and providing the column select signal to the first and the second portion. The method 600 may include selecting a set of bit lines in each of a plurality of column planes (e.g., 410 of FIG. 4) and writing the data to the memory cells which intersect the selected set of bit lines in each of the column planes and the activated portion of the word line.

In some embodiments, the method 600 may include generating a set of parity bits based on the data with an ECC circuit (e.g., 220 of FIG. 2, 312/313 of FIG. 3, and/or 432 of FIG. 4). The method 600 may include writing the parity bits to an extra column plane along the activated one of the first portion or the second portion.

An example read operation may be generally analogous to the example write operation of the method 600. For example, a read operation may include receiving a row address which includes a row driver select bit, selecting the first portion or the second portion of the word line based on the row select bit, activating the selected portion, receiving a read command and a column address, and reading the plurality of data bits from the memory cells along the activated portion of the word line. The read operation may also include reading the parity from memory cells along the selected portion in an extra column plane and detecting/correcting errors in the read data based on the parity with an ECC circuit.

FIG. 7 is a flow chart of a method of reading data and additional information from a memory device according to some embodiments of the present disclosure. The method 700 may be performed by one or more of the apparatuses or systems described herein. For example in some embodiments the method 600 may be performed by the memory devices 104 and/or 110 of FIG. 1, 200 of FIG. 2, 300 of FIG. 3, 400 of FIG. 4, and/or 500 of FIG. 5. In some embodiments the method 700 may be implemented on the same device as the method 600, however the method 700 represents an example operation in a mode where the storage of additional information has been enabled (e.g., in a mode register such as 230 of FIG. 2 and/or a module settings register such as 114 of FIG. 1). FIG. 7 will generally be described with respect to a half-page mode with additional information enabled (e.g., an 8×2p3 mode) however the method 700 may be implemented by other modes in other examples.

FIG. 7 may begin with box 710, which describes receiving a row address as part of a read operation. The row address may include a row driver select bit. The row driver select bit may be in addition to a number of bits of the row address used in modes where the additional information is disabled. The method 700 may also include receiving a read command and column address as part of the read operation. For example, the method 700 may include receiving the row address, column address, and read command along a C/A bus from a controller (e.g., 150 of FIG. 1). The row address, column address, and/or read command may be received at different times during the overall read operation.

Box 710 may be followed by box 720, which describes selecting a first portion or a second portion of a word line based on the row driver select bit of the row address. The selecting may be based on a state of the row driver select bit. The method 700 may include selecting one of a plurality of word lines based on a remainder of the row address (e.g., the portion of the row address excluding the row driver select bit) and selecting a portion of the selected word line based on the row driver select bit.

In an example implementation where there are two portions of the word line, the method 720 may include selecting a first row driver (e.g., 219a of FIGS. 2 and/or 304a of FIG. 3) associated with the first portion (e.g., WLa of FIGS. 2 and/or 302a of FIG. 3) responsive to the row driver select bit having a first value or selecting a second row driver (e.g., 219b of FIGS. 2 and/or 304b of FIG. 3) associated with the second portion (e.g., WLb of FIGS. 2 and/or 302b of FIG. 3) responsive to the row driver select bit having a second value. In some embodiments, the method 700 may include activating both portions of the word line, the selected portion and the non-selected portion.

Box 720 is followed by boxes 730 and 740. Box 730 describes reading a plurality of data bits from memory cells along the selected one of the first portion or the second portion of the word line. Box 740 describes reading a plurality of additional information bits (e.g., module parity bits and/or metadata bits) from memory cells along a non-selected one of the first portion or the second portion of the word line. In some embodiments, boxes 730 and 740 may occur more or less simultaneously as part of a same access operation. In embodiments where the word line is divided into two portions, then method may include reading the data bits from memory cells along one portion and reading the additional bits from memory cells along the other portion. For example, if the row driver select bit selects the first portion, then the additional bits are read from the second portion.

The method 700 may include providing a first column select signal (e.g., from a column decoder such as 210 of FIG. 2) to a plurality of column planes (e.g., 410 of FIG. 4) along the selected one of the first portion or the second portion and providing a second column select signal (e.g., from the column decoder) one or more column planes along the non-selected one of the first portion or the second portion. In some embodiments, the two column select signals may have different values from each other. The value of the first column select signal may be based on a column address, and the value of the second column select signal may be based on internal mapping which associates the second value with the first (and the row address).

Boxes 730 and 740 may generally be followed by box 750 which describes providing the plurality of data bits along a first set of data terminals and providing the plurality of additional information bits along at least one additional data terminal For example, the plurality of data bits may be provided along a first data terminal and a second data terminal. The bits of additional information may be provided along a third data terminal. The data may be provided with a burst length along the first set of data terminals. The burst length may match the burst length used when additional information is not enabled. In some embodiments, the method 700 may include providing the additional information with a burst length which matches the burst length along the first set of data terminals. For example, the method may include providing the additional information and junk bits along the third data terminal.

In some embodiments, the method may include reading parity bits from an extra column plane (e.g., 412 of FIG. 4) along the selected one of the first portion or the second portion of the word line. For example, the method may include providing a third column select signal from the column decoder to the extra column plane and reading the parity bits from the extra column plane. The third column select signal may have a same or different value from the first column select signal. The method 700 may include correcting errors in the data and additional information based on the data, additional information, and parity. The method 700 may include providing the corrected data and additional information along the first set of data terminals and at least one additional data terminal respectively.

Figure 11:
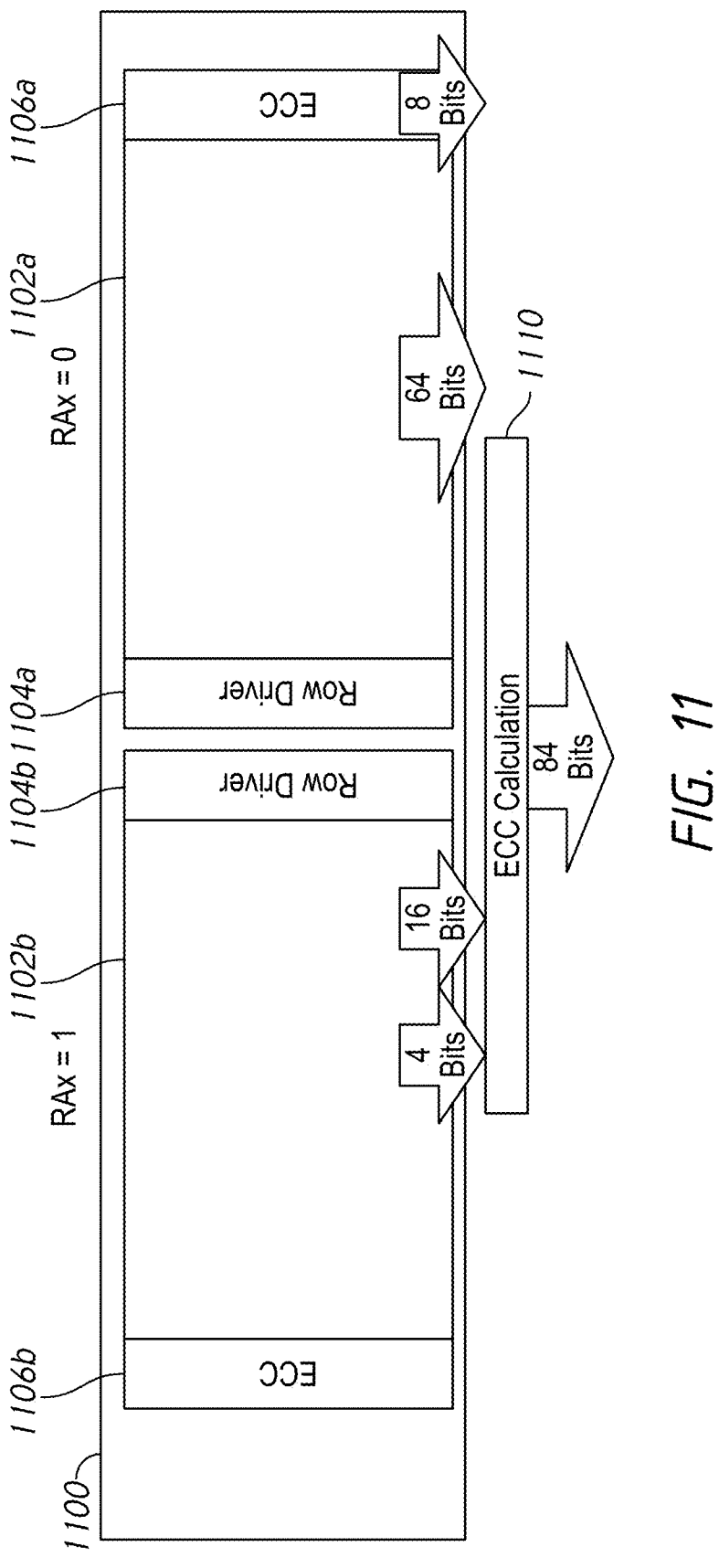
FIG. 11 is a is a block diagram of information storage in a memory array operating in a half-page mode with additional information such as an 8×2p3 high-reliability mode with metadata enabled according to some embodiments of the present disclosure.
Figure 12:
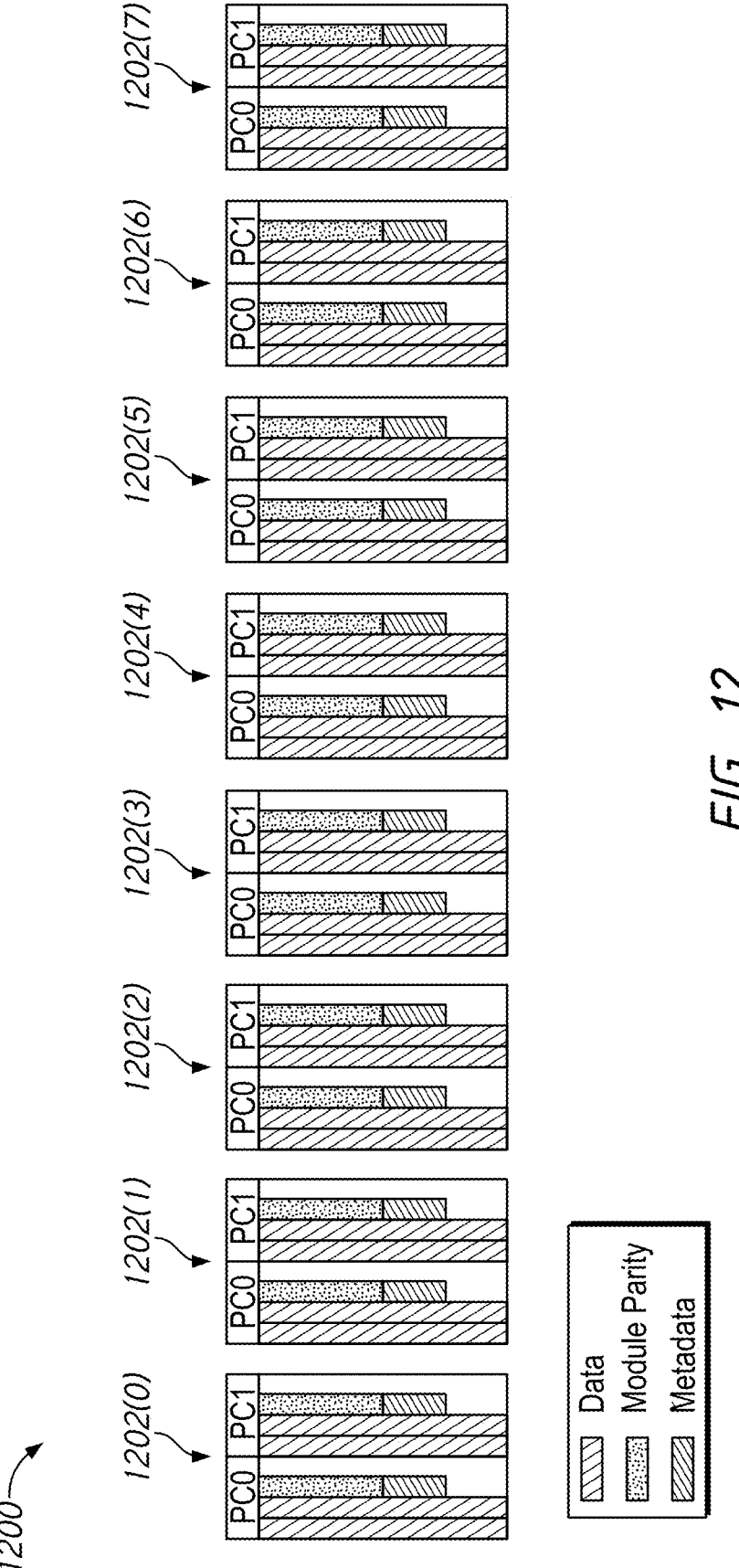
FIG. 12 is a block diagram of how data, module parity, and is transmitted along DQ terminals according to some embodiments of the present disclosure.

FIGS. 8-15 discuss various example embodiments where additional information is enabled in more detail. For example, FIGS. 8-10 and 14-15 discuss example embodiments where the additional information includes module parity bits and FIGS. 11-13 discuss an example embodiment where the additional information includes both module parity bits and metadata. In particular FIGS. 8-10 discuss an 8×2p3 high-reliability mode and FIGS. 14-15 discuss an 8×2p3 high-capacity mode. FIGS. 11-13 is described with respect to an example embodiment where metadata is enabled in an 8× high-reliability mode. Each of the examples of FIGS. 8-15 may be describe with respect to particular numbers of bits of module parity, data, metadata, etc. However, other example embodiments may use other numbers of bits.

The example embodiments of FIGS. 8-13 may be implemented by a memory system such as 100 of FIG. 1 in some embodiments. In some embodiments, the examples of FIGS. 8-15 may be implemented by memory devices, such as the ones discussed with respect to FIGS. 2-7, where different portions of the word line may be separately activated (e.g., by a row driver select bit of the row address). In some embodiments, the examples of FIGS. 8-15 may be implemented in other ways. For example, the entire word line may be activated by the row address and, the column address may include a column plane select bit which determines which portion of the column planes are selected.

Figure 8:
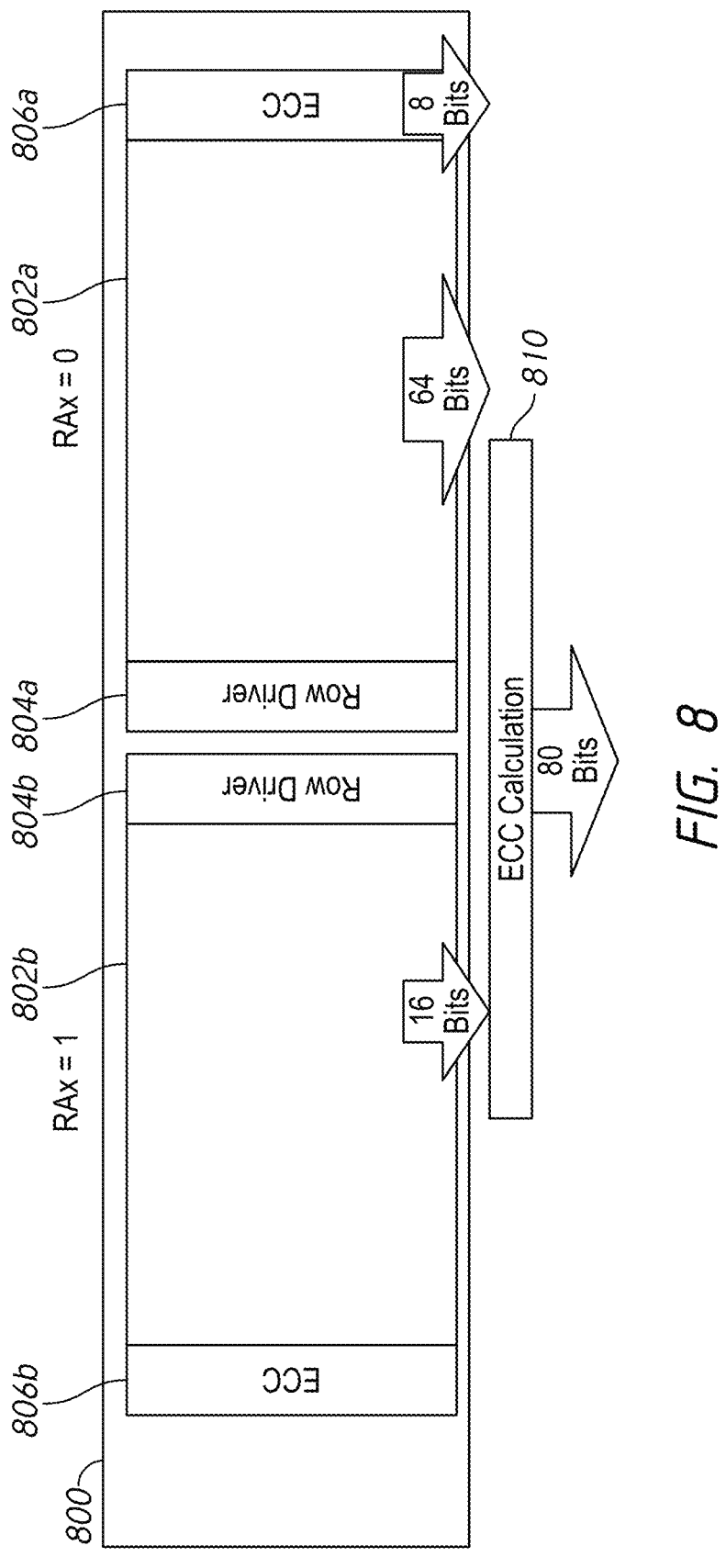
FIG. 8 is a block diagram of information storage in a memory array operating in a half-page mode with module parity such as an 8×2p3 high-reliability mode according to some embodiments of the present disclosure.

FIG. 8 is a block diagram of information storage in a memory array operating in a half-page mode with module parity such as an 8×2p3 high-reliability mode according to some embodiments of the present disclosure. The memory array 800 of FIG. 8 shows an example of data, its associated parity, and additional information may be stored in a memory array. In some embodiments, the memory array 800 may be a memory array where the word line portions are separately addressable (e.g., the memory array 218 of FIG. 2 and/or the portions 302 of FIG. 3).

FIG. 8 may be generally similar to FIG. 5, except that FIG. 8 shows a half-page mode where additional information is enabled (e.g., by a setting such as in the module settings register 114 of FIG. 1 and/or a mode register such as 230 of FIG. 2). In particular, FIG. 8 shows an embodiment where module parity is distributed among the data memory devices (e.g., an 8×2p3 mode). For the sake of brevity, certain details already described with respect to FIG. 5 will not be repeated again with respect to FIG. 8.

FIG. 8 shows a memory array 800 with two portions 802a and 802b (e.g., 302a and 302b of FIG. 3), each of which includes a number of word lines, selectively activated by a respective one of first set of row drivers 804a or a second set of row drivers 804b (e.g., 219a or 219b of FIGS. 2 and/or 304a or 304b of FIG. 3). Each of the two portions 802a and 802b includes a respective plurality of column planes (e.g., 410 of FIG. 4) and an extra column plane (e.g., 412 of FIG. 4).

FIG. 8 is described with respect to an example embodiment where each access operation reads or writes 64 bits of data along with 16 bits of module parity from/to the memory array 800 and the memory array includes an ECC circuit 810 which uses 8 bits of parity for on-die error correction. Other embodiments may use other numbers of data, module parity, and/or parity bits per access operation. The use of 16 bits of module parity may represent an example implementation of an 8× high-reliability mode.

During an example write operation, the controller (e.g., 150 of FIG. 1) provides 64 bits of data as two burst lengths of 32 bits along two DQ terminals. The controller also provides 16 bits of module parity from a controller ECC circuit (e.g., 152 of FIG. 1) along a third DQ terminal. The three DQ terminals may be part of the same the pseudo-channel. The module parity may be received as part of a 32 bit burst length where 16 bits are the module parity and 16 bits are junk bits (e.g., bits which are not latched by an I/O circuit or which are discarded). The module parity may represent a portion of the total number of bits of module parity generated by the controller's ECC circuit. The controller ECC circuit may generate a set of module parity which is associated with all of the bits of data divided across the module, and then the data and module parity are divided into portions, with each portion being stored on one of the data devices (e.g., 104 of FIG. 1). In this example, the data is divided into 8 portions of 64 bits each and the module parity is also divided into 8 portions of 16 bits each.

During the write operation, either the first or the second portion 802a and 802b is selected for storing data. For example, the portion may be selected based on a row driver select bit RAx. In this example, RAx has a value of 0, and the first portion 802a is selected for storing data. Since additional bits are stored, both the first and the second portion 802a and 802b are activated by their respective row drivers 804a and 804b. Which row driver and word line are activated in both portions is determined by a remainder of the row address. The ECC circuit 810 generates a set of parity bits based on the data bits and the module parity bits. In this example 8 parity bits are generated based on the 80 received bits (64 data bits and 16 module parity bits). The data is written to the selected portion 802a and the parity is written to the extra column plane 806a in the selected portion. The module parity bits are written to one or more column planes in the non-selected portion 802b. Since there are 16 bits of module parity, the module parity may be written to two column planes. In some embodiments, a first column select signal is provided to the selected portion 802a, while a second column select signal is provided to the non-selected portion 802b.

An example read operation may be generally similar to the example write operation. A first or second portion is selected based on the row driver select bit, but both portions are activated. The data is read from the selected portion 802a and the parity is read from the extra column plane 806a in the selected portion. The module parity bits are read from the non-selected portion 802b. The ECC circuit 810 receives the data, module parity, and parity bits and then detects and corrects the data and module parity based on the parity bits. The corrected data and module parity is then provided through an I/O circuit (not shown) to the DQ terminals. The data is provided as two bursts of 32 bits each along two DQ terminals, while the module parity bits are provided along a third DQ terminal. The module parity may be provided in a 32 bit burst length to match the burst length with the data, where the 16 bits of module parity are provided with 16 junk bits.

Figure 9:
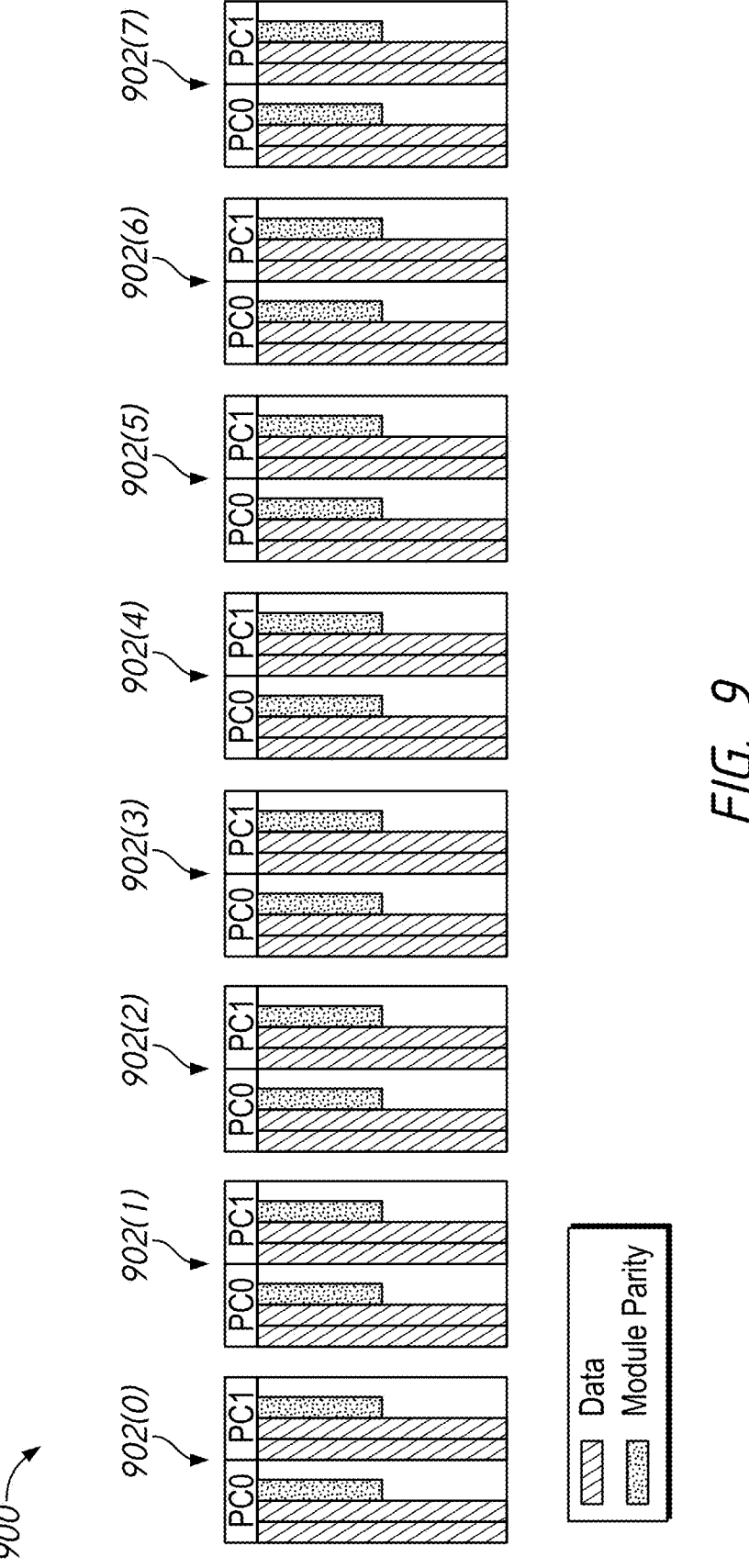
FIG. 9 is a block diagram of how data and module parity is transmitted along DQ terminals according to some embodiments of the present disclosure.

FIG. 9 is a block diagram of how data and module parity is transmitted along DQ terminals according to some embodiments of the present disclosure. The diagram 900 represents a set of DQ terminals on a set of memory devices 902 (e.g., 104 of FIG. 1) of a memory module (e.g., 102 of FIG. 1). FIG. 9 represents an example embodiment where there are 8 memory devices, and each memory device includes 8 DQ terminals, and the device operates in a 2p3 mode where with additional information enabled. In particular, FIG. 9 may represent an 8×2p3 high-reliability mode, where each device sends/receives 64 bits of data and 16 bits of module parity per access operation.

Each memory device 902 shows two example pseudo-channels, labeled PC0 and PC1. Each pseudo-channel includes four physical DQ terminals, although since this is a 2p3 mode, two are used for data. One of the extra two DQ terminals is used for the additional information, which in this example is module parity. The columns represent the physical DQ terminals, while the filled in boxes represent a burst length of information being transmitted along the DQ terminal. The shading represents the type of information, data or additional information. The diagram 900 shows data and additional information along both pseudo-channels of each device PC0 and PC1, however each pseudo-channel may be operated separately from each other.

In an example access operation, data and additional information are transmitted along the DQ terminals of a pseudo-channel. Data is transmitted along a first DQ terminal and a second DQ terminal in a burst length of 32 bits each, for a total of 64 bits of data. Additional information, in this case module parity, is transmitted along a third DQ terminal of the pseudo-channel. In this example embodiment, 16 bits of module parity are transmitted along the third DQ terminal. In order to match the length of the burst length along the first two DQ terminals, extra junk bits may be provided (e.g., 16 bits of module parity and 16 bits of junk).

During a given access operation, data and module parity may be written to or read from one of the pseudo-channels across the 8 data memory devices. During a write operation, the ECC circuit of the controller (e.g., ECC circuit 152 of FIG. 1) generates 128 bits of module parity based on 512 bits of data. How many bits are generated may be based on a setting of the module (e.g., in the module settings register 114 of FIG. 1), in the device settings (e.g., in mode register 230 of FIG. 2) or combinations thereof. The data and module parity are divided into portions of 64 data bits and 16 module parity bits, and each portion is written to one of the data memory device. Similarly, during a read operation, the portions of the data and module parity are read out from the 8 data devices and provided to the ECC circuit on the controller, which performs error correction based on the data and module parity.

A module level error correction circuit, such as 152 of FIG. 1, may receive the data and module parity from the memory devices 902. In this example embodiment, an 8×2p3 high-reliability mode, the controller receives 512 bits of data (e.g., 64 bits each from 8 devices) and 128 bits of module parity (e.g., 16 bits each from 8 devices). The module error correction circuit may be capable of repairing up to an entire devices worth of data (e.g., chipkill) based on the module parity. For example, one entire device 902 may have its data repaired.

FIG. 10 is a flow chart of a method of writing data and module parity to a memory device according to some embodiments of the present disclosure. The method 1000 may be performed by one or more of the apparatuses and systems described herein. For example, the method 1000 may be performed by a memory device such as 104 of FIG. 1, 200 of FIG. 2, 300 of FIG. 3, and/or 400 of FIG. 4. The method 1000 may represent a method of performing access operations in a 2p2 mode with module parity as additional information enabled, similar to the operations described with respect to FIGS. 8 and 9, in some embodiments.

The method 1000 may generally begin with box 1010, which describes receiving a plurality of data bits along a first set of data terminals and receiving a plurality of module parity bits along at least one additional data terminal as part of a write operation. The method 1000 may also include receiving a row and column address, as well as a write command, along a command address bus. The method 1000 may include generating a set of module parity bits based on a set of data bits with an ECC circuit (e.g., 152 of FIG. 1) on a controller (e.g., 150 of FIG. 1) and dividing the set of module parity bits and the set of data bits into portions. The plurality of data bits may be one of the portions of the set of data bits and the plurality of module parity bits may be one of the portions of the set of module parity bits.

In an example implementation, the first set of data terminals may include two data terminals (e.g., DQ0 and DQ1). Each data terminal may receive a portion of the plurality of data bits in a burst length. For example, method may include receiving 32 bits of data along the first data terminal and 32 bits of data along the second terminal and receiving 16 bits of module parity along a third DQ terminal (e.g., DQ2).

Box 1010 may be followed by box 1020, which describes selecting a first portion or a second portion of memory cells along a word line. In some embodiments, the method 1000 may include selecting a first portion or a second portion of a word line. The first or the second portion may be selected based on a row driver select bit of the row address. For example, the method 1000 may be implemented on a memory device with separately addressable row drivers such as 200 of FIGS. 2 and/or 300 of FIG. 3. In some embodiments, the method 1000 may use other methods of selecting the first or the second portion, for example selecting a first set of column planes or a second set of column planes based on a column plane select bit of the column address.

Box 1020 is followed by boxes 1030 and 1040. Box 1030 describes writing the plurality of data bits to the selected one of the first portion or the second portion of the memory cells. Box 1040 describes writing the plurality of module parity bits to a non-selected one of the first portion or the second portion of the memory cells. For example, if the data is written to memory cells of the first portion (e.g., because the row driver select bit is in the first state), then the module parity is written to memory cells of the second portion and vice versa. The method 1000 may include providing a first column select signal from a column decoder (e.g., 210 of FIG. 2) to column planes (e.g., 410 of FIG. 4) which include the first portion of the memory cells and writing the data along the bit lines selected by the first column select signal and providing a second column select signal from the column decoder to one or more column planes which include the second portion of the memory cells. In some embodiments, the first portion of the memory cells may be organized into a first plurality of column planes and the second portion of the memory cells may organized into a second plurality of column planes. The method 1000 may include writing the data to the first plurality of column planes and selecting the one or more column planes from the second plurality of column planes to write the plurality of module parity bits to. The first column select signal may be based on the column address, and the second column select signal may be related to the first column select signal based on internal mapping based on the first column select signal. The first and the second column select signals may have different values from each other. Similarly, which of the second plurality of column planes are selected may also be determined based on internal mapping. For example, the first plurality of and the second plurality of column planes may each include 8 column planes. The 64 data bits may be written to each of the 8 column planes in the first plurality of column planes. The 16 bits of module parity may be written to two of the 8 column planes in the second plurality of column planes.

In some embodiments, the method 1000 may include generating a set of parity bits based on the plurality of data bits and the plurality of module parity bits with a ECC circuit (e.g., 220 of FIG. 2, 312/313 of FIG. 3, 432 of FIG. 4, and/or 810 of FIG. 8). The method 100 may include writing the set of parity bits to an extra column plane (e.g., 412 of FIGS. 4 and/or 806a/806b of FIG. 8) associated with the selected one of the first or the second portion of memory cells along the word line. The method 1000 may include generating a third column select signal and writing the parity to bit lines of the extra column plane. The third column select signal may have a same or different value as the first and second column select signals.

An example read operation may be generally analogous to the method 1000, except the read operation includes reading the plurality of data bits from the selected one of the first or the second portion and reading the plurality of module parity bits from the non-selected one of the first or the second portion and providing the data bits along the first set of data terminals and providing the module parity bits alone the at least one additional data terminal. As part of the read operation the method 1000 may include reading the parity bits from the extra column plane and correcting or detecting errors in the data and module parity based on the parity.

In some embodiments, the method 1000 may include both module parity and metadata. For example, the box 1010 may include receiving the plurality of module parity bits and a plurality of metadata bits along the at least one additional data terminal as part of the write operation. The box 1040 may include writing the plurality of module parity bits and the metadata bits to the non-selected one of the first or second portion of the memory cells.

In some embodiments, the method 1000 may include selecting an amount of module parity bits. For example, a user of the device may change a settings register of the module, the devices or combinations thereof to select a first mode with a first amount of module parity (e.g., an 8×2p3 high-reliability mode) or a second mode with a second amount of module parity (e.g., an 8×2p3 high-capacity mode). The method may include receiving a plurality of data bits at a module level error correction circuit (e.g., 152 of FIG. 1) and generating either the first or the second amount to module parity as part of a write operation. As part of a read operation, the method 1000 may include reading the first or the second amount of module parity and the amount of data to the module level correction circuit and performing a first level or a second level of error correction. For example the first level may be chipkill (e.g., correction of an entire device's data) while the second level may be less than chipkill (e.g., correction of part of the data from a device). FIG. 15 discusses an example method of selecting module level error correction in more detail.

FIG. 11 is a is a block diagram of information storage in a memory array operating in a half-page mode with additional information such as an 8×2p3 high-reliability mode with metadata enabled according to some embodiments of the present disclosure. The memory array 1100 of FIG. 11 shows an example of data, its associated parity, and additional information may be stored in a memory array for example as part of an 8×2p3 mode. In some embodiments, the memory array 1100 may be a memory array where the word line portions are separately addressable (e.g., the memory array 218 of FIG. 2 and/or the portions 302 of FIG. 3).

In particular FIG. 11 shows an example embodiment where the additional information includes both module parity bits and metadata. FIG. 11 may generally be similar to FIG. 5 and FIG. 8, except that FIG. 11 shows an example operational mode where the additional information is enabled and also includes metadata. For the sake of brevity, details already described with respect to FIG. 5 and/or FIG. 8 will not be repeated again with respect to FIG. 11. In some embodiments, the operation of FIG. 11 may be performed by the same hardware as the operation of FIG. 5 and/or FIG. 8, but with different amounts of additional information enabled.

FIG. 11 is described with respect to an example embodiment where each access operation reads or writes 64 bits of data along with 16 bits of module parity and 4 bits of metadata from/to the memory array 1100 along with 8 bits of parity from the ECC circuit 1110 for on-die error correction. Other embodiments may use other numbers of data, module parity, metadata, and/or parity. FIG. 11 is generally discussed with respect to a 8×2p3 high-reliability mode, and the corresponding amount of module parity (e.g., 16 bits stored per access operation). However, metadata may also be enabled in an 8×2p3 high-capacity mode (e.g., 8 bits of module parity per access operation).

In an example write operation, the controller (e.g., 150 of FIG. 1) provides 64 bits of data as two burst lengths of 32 bits along two DQ terminals. The controller also provides 16 bits of module parity from a controller ECC circuit (e.g., 152 of FIG. 1) and 4 bits of metadata along a third DQ terminal. The three DQ terminals may be part of a same pseudo-channel. The module parity and metadata may be received as part of a 32 bit burst where 20 bits are the module parity and metadata and 12 bits are junk bits. As with previous examples, the data, module parity, and metadata may each represent portions of an overall set of data, set of module parity, and set of metadata generated by the controller and divided into portions which are stored in individual memory devices (e.g., 104 of FIG. 1).

During a write operation, either a first portion 1102a or a second portion 1102b is selected. For example, the portion may be selected based on a row driver select bit RAx. In the example shown in FIG. 11, RAx has a value of 0, and so the first portion 1102a is selected. Since additional bits are stored, both portions 1102a and 1102b of the word line are activated by their respective row drivers 1104a and 1104b. The ECC circuit 1110 generates a set of 8 parity bits based on the 84 bits from the controller (64 data bits, 16 module parity bits and 4 metadata bits). The 64 data bits are written to the data column planes (e.g., 410 of FIG. 4) of the selected portion 1102a while the 8 parity bits are written to an extra column plane 1106a along the selected portion 1102a. The 16 module parity bits and the 4 metadata bits are written to one or more column planes of the non-selected portion 1102b. For example, the module parity may be written to 2 column planes and the metadata may be written to a single column plane. In some embodiments, a first column select signal is provided to the selected portion 1102a while a second column select signal is provided to the non-selected portion 1102b.

An example read operation may generally be similar to the example write operation. The 88 bits (64 data bits, 16 module parity bits, 4 metadata bits, and 8 parity bits) are read out to the ECC circuit 1110, which detects/corrects errors in the 80 bits of data, module parity, and metadata. The corrected 80 bits are providing to the I/O circuit, which provides them along the DQ terminals. The 64 data bits are provided as two 32 bit bursts along a first and second DQ terminal. The 16 module parity bits and 4 metadata bits are provided along a third DQ terminal.

FIG. 12 is a block diagram of how data, module parity, and is transmitted along DQ terminals according to some embodiments of the present disclosure. The diagram 1200 represents a set of DQ terminals on a set of memory devices 1202 (e.g., 104 of FIG. 1) of a memory module (e.g., 102 of FIG. 1). FIG. 12 represents an example embodiment where there are 8 memory devices, each of which includes 8 DQ terminals organized into two pseudo-channels, where within a pseudo-channel two DQ terminals are used for data and one or more of the other two may be used for additional information (e.g., an 8×2p3 mode).

The diagram 1200 may be generally similar to the diagram 900 of FIG. 9 except that in FIG. 12, metadata is also enabled as well as module parity so the amount of additional information has increased. For the sake of brevity, features and operations already described with respect to FIG. 9 will not be repeated again with respect to FIG. 12. FIG. 12 is described with respect to an amount of module parity based on an 8×2p3 high-reliability mode with metadata enabled, however metadata may also be enabled with the 8×2p3 high-capacity mode.

In the operation represented by the diagram 1200, each pseudo-channel transmits 64 total bits of data, split into two burst lengths along a first and second DQ terminal as well as 20 bits of additional information (16 bits of module parity and 4 bits of metadata) along a third DQ terminal. In some embodiments, to match the amount along the first two DQ terminals, an extra 12 junk bits may be transmitted along the third DQ terminal. More or fewer metadata bits may be used in other example embodiments.

FIG. 13 is a flow chart of a method of providing additional information along additional data terminals when additional information is enabled according to some embodiments of the present disclosure. The method 1300 may, in some embodiments, be performed by one or more of the apparatuses and/or systems described herein. For example, the method 1300 may be performed by a memory device such as 104 of FIG. 1, 200 of FIG. 2, 300 of FIG. 3, 400 of FIG. 4, and/or 1100 of FIG. 11.

The method 1300 describes two operational modes of the memory device. The first mode is a mode where additional information is not enabled (e.g., a 8×2p2 mode). The second mode is a mode where additional information is enabled (e.g., an 8×2p3 mode). Which mode the device is in may be a setting of a device level settings register (e.g., mode register 230 of FIG. 2) and/or a module level settings register (e.g., 114 of FIG. 1). For the sake of comparison, the method 1300 describes an example read operation with respect to both modes.

The method 1300 may generally begin with box 1310, which describes receiving a row address as part of a read operation. The row address is received along command/address terminals. Box 1310 may also include receiving column address as well as a read command. The steps of box 1310 may generally be the same in the first mode and the second mode.

Box 1310 is followed by box 1320 which describes determining if the device is in the first mode or the second mode. The method 1300 may include checking a status of one or more registers, such as mode registers of the device. If the device is in the first mode, the method 1300 includes boxes 1310, 1330 and 1340. If the device is in the second mode, the method 1300 includes boxes 1310, 1350, and 1360.

If the device is in the first mode, then box 1310 may be followed by box 1330, which describes reading a plurality of data bits from a memory array. The method 1300 may include selecting a first portion or a second portion of a plurality of memory cells. For example, the method 1300 may involve selecting a first portion or a second of a word line based on a row driver select bit of the row address (e.g., analogous to the method 600 of FIG. 6). The method 1300 may include reading the plurality of data bits from the selected one of the first portion or the second portion.

Box 1330 may generally be followed by box 1340, which describes providing the data bits along a first set of data terminals with a first burst length. For example, the method 1300 may include providing 64 bits of data along two DQ terminals with a burst length of 32 bits.

If the device is in the second mode, box 1310 may generally be followed by box 1350, which describes reading a plurality of data bits and a plurality of bits of additional information from the memory array. For example, the additional information may include module parity and metadata in some embodiments, similar to the embodiments of FIGS. 11-12. In some embodiments, the number of bits of data read in the second mode may be the same as the number of bits read in the first mode.

Box 1350 may, in some embodiments, include selecting a first portion or a first portion of the memory cells along a word line (e.g., similar to the selecting described with respect to Box 1330 of the first mode). Box 1350 may include reading the plurality of data bits from the selected one of the first or second portion and reading the additional information from the non-selected one of the first portion or the selected portion.

Box 1350 may generally be followed by box 1360, which describes providing the data bits along the first set of data terminals with the first burst length and providing the additional information along at least one additional data terminal. The first burst length used in the second mode may match the first burst length used in the first mode. In other words the method 1300 may include maintaining a same burst length for the data and changing a number of DQ terminals that the information (e.g., data and additional information) is provided along. For example, the method 1300 may include providing the data along two data terminals with a burst length of 32 bits and providing the additional information along a third DQ terminal. The amount of additional information provided may be based on settings of the device and/or module. For example, in an 8×2p3 high-reliability mode with metadata enabled, the method 1300 may include providing 20 bits of additional information, 16 bits of module parity and 4 bits of metadata. In an 8×2p3 high-capacity mode with metadata enabled, the method 1300 may include providing 12 bits of additional information, 8 module parity bits and a 4 bits of metadata. More or fewer bits of module parity and/or metadata may be used in other examples.

In some embodiments, the method 1300 may include reading parity bits from the memory array and using the parity bits to detect/correct errors in the read data or data and additional information. For example, the method 1300 may include reading the parity from an extra column plane (which may be associated with the selected one of the first portion or the second portion of the memory cells) in either the first or the second mode.

A write operation may be performed in a manner generally analogous to the method 1300. For example, a write operation may include receiving a row address along with a write command, data, and if the device is in the second mode, additional information. In the first mode the data may be received along a first set of data terminals with a first burst length. In the second mode the data bits are received along the first set of data terminals with the first burst length and the additional information is received along the at least one additional data terminal. For example, in either the first or the second mode, 64 data bits are received in 32 bit burst lengths along DQ0 and DQ1, while the additional information is received in the second mode along DQ2. The data (and additional information) may be provided to an ECC circuit which generates parity based on the data (and additional information) in some embodiments. The data, additional information (in the second mode), and parity (in some embodiments), is then written to the memory array. The data (and parity) may be written to a selected portion of the memory array (e.g., selected by a row driver select bit) in either the first or second mode. In the second mode, the additional information may be written to the non-selected portion.

Figure 14:
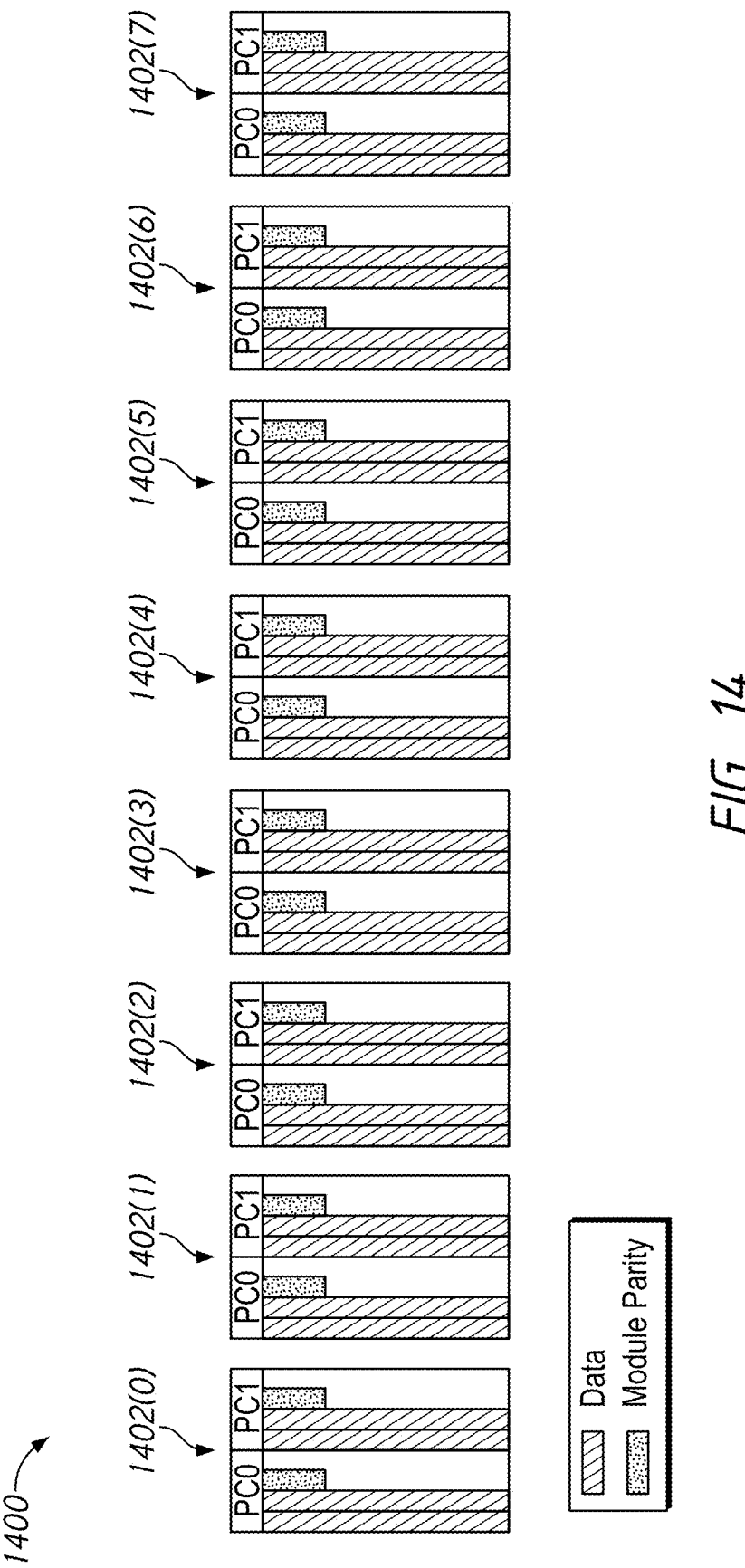
FIG. 14 is a block diagram of how data and module parity is transmitted along DQ terminals according to some embodiments of the present disclosure.

FIG. 14 is a block diagram of how data and module parity is transmitted along DQ terminals according to some embodiments of the present disclosure. The diagram 1400 represents a set of DQ terminals on a set of memory devices 1402 (e.g., 104 of FIG. 1) of a memory module (e.g., 102 of FIG. 1). FIG. 14 represents an example embodiment where there are 8 memory devices and each memory device includes 8 DQ terminals, and the device operates in 2p3 mode with additional information enabled. In particular, FIG. 13 may represent an 8×2p3 high-capacity mode where each device sends/receives 64 bits of data and 8 bits of module parity. FIG. 14 may be generally similar to FIG. 9, except that FIG. 9 represents an 8×2p3 high-reliability mode and FIG. 14 represents an 8×2p3 high-capacity mode, for the sake of brevity, certain details and operations already described with respect to FIG. 9 may not be repeated with respect to FIG. 14.

Each memory device 1402 shows two example pseudo-channels, labeled PC0 and PC1. Each pseudo-channel includes four physical DQ terminals, although since this is a 2p3 mode, two are used for data. One of the extra two DQ terminals is used for the additional information, which in this example is module parity. The columns represent the physical DQ terminals, while the filled in boxes represent a burst length of information being transmitted along the DQ terminal. The shading represents the type of information, data or module parity. The diagram 1400 shows data and additional information along both pseudo-channels of each device PC0 and PC1, however each pseudo-channel may be operated separately from each other.

In an example access operation, data and additional information are transmitted along the DQ terminals of a pseudo-channel. Data is transmitted along a first DQ terminal and a second DQ terminal in a burst length of 32 bits each, for a total of 64 bits of data. Additional information, in this case module parity, is transmitted along a third DQ terminal of the pseudo-channel. In this example embodiment, 8 bits of module parity are transmitted along the third DQ terminal. In order to match the length of the burst length along the first two DQ terminals, extra junk bits may be provided (e.g., 8 bits of module parity and 24 bits of junk).

During a given access operation, data and module parity may be written to or read from one of the pseudo-channels across the 8 data memory devices. During a write operation, the ECC circuit of the controller (e.g., ECC circuit 152 of FIG. 1) generates 64 bits of module parity based on 512 bits of data. How many bits are generated may be based on a setting of the module (e.g., in the module settings register 114 of FIG. 1), in the device settings (e.g., in mode register 230 of FIG. 2) or combinations thereof. The data and module parity are divided into portions of 64 data bits and 8 module parity bits, and each portion is written to one of the data memory device. Similarly, during a read operation, the portions of the data and module parity are read out from the 8 data devices and provided to the ECC circuit on the controller, which performs error correction based on the data and module parity.

A module level error correction circuit, such as 152 of FIG. 1, may receive the data and module parity from the memory devices 1402. In this example embodiment, an 8×2p3 high-capacity mode, the controller receives 512 bits of data (e.g., 64 bits each from 8 devices) and 64 bits of module parity (e.g., 8 bits each from 8 devices). The module error correction circuit may be capable of repairing a portion of the data from one of the devices 1402. For example, the module error correction circuit may be capable of repairing the information along one of the two DQ terminals of each pseudo-channel in a single device.

In some embodiments, the 8×2p3 high-capacity mode represented by FIG. 14 may be implemented by memory devices similar to the memory device 800 of FIG. 8. For example, 64 bits of data may be stored in a selected portion 802a, while 8 bits of module parity may be stored in the non-selected portion 802b. Since fewer bits of module parity are stored on each device, more of the device may be available for storing information, which is why the embodiment with 8 bits of module parity may be referred to as a high-capacity mode relative to the embodiment with 16 bits of module parity.

In some embodiments, the memory module may be configured to operate in either an 8×2p3 high-reliability mode or an 8×2p3 high-capacity mode. For example, settings on the controller, module, and/or memory device may specify how many bits of module parity to use. A user may select which mode to operate in by programming such settings. This may offer an advantage compared to memory devices where the amount of module parity is determined by how many physical error correction devices (e.g., 110 of FIG. 1) are placed on the module. In either the high-reliability or high-capacity modes, metadata may also be enabled.

FIG. 15 is a method of switching between module parity modes according to some embodiments of the present disclosure. The method 1500 of FIG. 15 may be implemented by one or more of the apparatuses or systems described herein. For example, the method 1500 may be implemented by a memory module such as 102 of FIG. 1 as part of a memory system such as 100 of FIG. 1. In some embodiments, the memory module may include a number of devices such as the devices 200 of FIG. 2, 300 of FIG. 3, and/or 400 of FIG. 4.

The method 1500 begins with box 1510, which describes selecting a first mode or a second mode for a memory module. The selecting may include writing to one or more settings registers of the module, controller, memory devices of the module, or combinations thereof. For example, the method 1500 may include writing to a mode register such as 230 of FIG. 2 on the memory devices of a module and/or writing to a module settings register such as 114 of FIG. 1. In some embodiments, the method 1500 may include changing the operation of the memory system from the first mode to the second mode. The changing may be done after the device is manufactured (e.g., by a user of the memory system).

Box 1510 is followed by box 1520, which describes determining whether the system is in the first mode or the second mode. Which mode the system is in may be based on one or more settings, which may have been set as part of the steps of box 1510. If the system is in the first mode, the method proceeds to box 1530. If the system is in the second mode, the method 1500 proceeds to box 1540.

Box 1530 describes storing a respective portion of a plurality of data bits and a respective portion of a first number of module parity bits on each memory device of the module in the first mode. Box 1540 describes storing a respective portion of a plurality of data bits and a respective portion of a second number of module parity bits on each memory device of the memory module in the second mode. The first number may be greater than the second number. For example, the first mode may be an 8×2p3 high-reliability mode, while the second mode may be an 8×2p3 high-capacity mode. The number of data bits may be the same between the first mode and the second mode.

As part of an example write operation, the method may include generating the first number of module parity bits based on the data bits in the first mode or generating the second number of module parity bits based on the data bits in the second mode, with a module level error correction circuit such as 152 of FIG. 1. The example write operation may include dividing the plurality of data bits and the module parity bits into a number of portions. The number of portions may match the number of memory devices on the module. For example, the data and module parity may be divided into 8 portions. The write operation may include providing each memory device with the respective portion of the data bits and the respective portion of the module parity bits. For example the write operation may include providing the portion of the data bits along a first set of data terminals associated with the device and providing the portion of the module parity along at least one additional data terminal. The write operation may include the steps of the method 1000 of FIG. 10 in some embodiments.

As part of an example read operation, the method may include reading the respective portions of the data and module parity from each of the devices of the module. For example, the method 1500 may include the method 700 of FIG. 7. The read operation may include receiving the data and module parity at a module level error correction circuit (e.g., 152 of FIG. 1). The read operation may include combining the respective portions of the data and parity bits from each of the devices into the plurality of data bits and the plurality of module parity bits (e.g., either the first or the second number based on the mode). The read operation may include performing a first level of error correction in the first mode or a second level of error correction in the second mode. The first level of error correction may include correcting data along up to a first number of data terminals associated with a device while the second level may include correcting data along up to a second number of data terminals associated with a device. For example, the first level may include correcting data along up to four DQ terminals, both DQ terminals of both the two pseudo-channels of one device (e.g., chipkill) while the second level may include correcting data along up to two DQ terminals, one of the DQ terminals of both pseudo-channels. The first level of error correction may include correcting up to the entire portion of the data read from a single one of the memory devices, while the second level of error correction may include correcting up to less than the entire portion of the data read from a single one of the memory devices.

In some embodiments, the method 1500 may include enabling metadata in the first or the second mode. The method 1500 may include storing a respective portion of a plurality of metadata bits on each of the memory devices in either the first or the second mode. The method 1500 may include generating the module parity bits based on the data and the metadata as part of the write operation and correcting the data and metadata as part of a read operation.

In some embodiments, the method 1500 may include addressing a first amount of space for data storage on the memory devices in the first mode or a second amount of space for data storage on the memory devices in the second mode. Since the first mode may need to make room for a larger amount of module parity, in the first mode the method may include setting aside a first number of memory cells on each device for storing module parity and in the second mode the method may include setting aside a second number of memory cells on each device for storing module parity. The first number of memory cells may be greater than the second number of memory cells. In other words, in the first mode the data devices may have a first amount of capacity for data storage and in the second mode the data devices may have a second amount of capacity for data storage which is greater than the first amount.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a plurality of data terminals configured to receive a plurality of data bits and a plurality of additional information bits as part of a write operation;

a word line comprising a first portion coupled to a first plurality of memory cells and a second portion coupled to a second plurality of memory cells;

a row decoder configured to receive a row address as part of the write operation, wherein the row address selects one of the first portion or the second portion, wherein the plurality of data bits are written to the selected one of the first portion or the second portion of the word line and the plurality of additional information bits are written to a non-selected of the first portion or the second portion of the word line as part of the write operation.

2. The apparatus of claim 1, further comprising a column decoder configured to receive a column address and provide a first column select signal to a first plurality of column planes along the selected one of the first portion or the second portion of the word and configured to provide a second column select signal to one or more column planes along the non-selected one of the first portion or the second portion of the word line.

3. The apparatus of claim 1, wherein the row address includes at least one row driver select bit, and wherein the row decoder is configured to select the first or the second portion of the word line based on the at least one row driver select bit.

4. The apparatus of claim 1, further comprising:
a first row driver coupled to the first portion of the word line; and
a second row driver coupled to the second portion of the word line,
wherein the row decoder is configured to selectively activate the first row driver or the second row driver based on the row address.

5. The apparatus of claim 1, wherein the additional information includes module parity, metadata or combinations thereof.

6. The apparatus of claim 1, wherein the plurality of data terminals includes a first set of data terminals configured to receive the plurality of data bits and at least one additional data terminal configured to receive the plurality of additional information bits.

7. The apparatus of claim 1, further comprising an error correction circuit configured to generate a plurality of parity bits based on the plurality of data bits and the plurality of additional information bits, wherein the plurality of parity bits are written to the selected one of the first portion or the second portion of the word line.

8. An apparatus comprising:
a first set of data terminals;
at least one additional data terminal;
a memory array comprising a word line coupled to a plurality of memory cells;
a row decoder configured to select a first portion or a second portion of the plurality of memory cells based on a row address as part of a read operation,
wherein data from the selected one of the first portion or the second portion of the plurality of memory cells is provided to the first set of data terminals and additional information from a non-selected one of the first portion or the second portion of the plurality of memory cells is provided to the at least one additional data terminal.

9. The apparatus of claim 8, wherein the row decoder is configured to select the first portion or the second portion based on a value of a row driver select bit included in the row address.

10. The apparatus of claim 8, wherein the word line includes a first portion and a second portion, wherein the first portion of the word line is coupled to the first plurality of memory cells and wherein the second portion of the word line is coupled to the second plurality of memory cells.

11. The apparatus of claim 10, further comprising:
a first row driver coupled to the first portion of the word line; and
a second row driver coupled to the second portion of the word line.

12. The apparatus of claim 8, further comprising an error correction circuit,
wherein parity bits from the selected one of the first portion or the second portion are provided with the data and the additional information to the error correction circuit,
wherein the error correction circuit is configured to detect errors in the data and the additional information based on the parity.

13. The apparatus of claim 8, wherein the first set of data terminals, the at least one additional data terminal, the memory array, and the row decoder are included in a memory configured to operate in an 2p3 mode.

14. The apparatus of claim 8, wherein the additional information includes metadata associated with the data.

15. A method comprising:
receiving a row address at a memory device as part of a read operation;
selecting a first portion or a second portion of a word line based on the row address;
reading a plurality of data bits from memory cells along the selected one of the first portion or the second portion of the word line;
reading a plurality of additional information bits from memory cells along a non-selected one of the first portion or the second portion of the word line; and
providing the plurality of data bits along a first set of data terminals and providing the plurality of additional information bits along at least one additional data terminal.

16. The method of claim 15, further comprising selecting the first portion or the second portion of the word line based on a value of a row driver select bit of the row address.

17. The method of claim 15, further comprising:
reading a plurality of parity bits from memory cells along the selected one of the first portion or the second portion;
detecting errors in the plurality of data bits and the additional information bits based on the plurality of parity bits.

18. The method of claim 15, further comprising:
providing a first column select signal to the first portion of the word line; and
providing a second column select signal to the second portion of the word line.

19. The method of claim 15, wherein the plurality of additional information bits includes a plurality of module parity bits,
the method further comprising providing the plurality of data bits and the plurality of additional information bits to an error correction circuit of a controller.

20. The method of claim 15, further comprising:
enabling a half-page mode of the memory device; and
receiving the row address with a length greater than the row address when the half-page mode is not enabled.

* * * * *